US012620442B2

(12) United States Patent
Deng

(10) Patent No.: US 12,620,442 B2
(45) Date of Patent: May 5, 2026

(54) MANAGING PROGRAM DISTURB IN MEMORY DEVICES

(71) Applicant: Yangtze Memory Technologies Co., Ltd., Hubei (CN)

(72) Inventor: Zihao Deng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 124 days.

(21) Appl. No.: 18/770,632

(22) Filed: Jul. 11, 2024

(65) Prior Publication Data

US 2025/0329389 A1 Oct. 23, 2025

(30) Foreign Application Priority Data

Apr. 19, 2024 (CN) ......................... 202410479948.3

(51) Int. Cl.
*G11C 16/12* (2006.01)
*G11C 16/04* (2006.01)
*G11C 16/08* (2006.01)
*G11C 16/10* (2006.01)
*G11C 16/34* (2006.01)

(52) U.S. Cl.
CPC .......... *G11C 16/10* (2013.01); *G11C 16/0483* (2013.01); *G11C 16/08* (2013.01); *G11C 16/3427* (2013.01); *G11C 16/12* (2013.01)

(58) Field of Classification Search
CPC ..................................................... G11C 16/12
See application file for complete search history.

(56) References Cited

U.S. PATENT DOCUMENTS

2023/0145681 A1* 5/2023 Joe ......................... G11C 16/12
365/189.011

* cited by examiner

*Primary Examiner* — Jason Lappas
(74) *Attorney, Agent, or Firm* — Fish & Richardson P.C.

(57) ABSTRACT

Example apparatus and methods for managing program disturb in flash memory are disclosed. In one example, a memory device can include a memory string including a first select gate transistor, a second select gate transistor, and memory cells positioned in between. A peripheral circuit is configured to apply, during a program operation of a first memory cell, a first voltage to the first select gate transistor. The first memory cell is coupled to a first word line closest to the first select gate transistor among word lines coupled to the memory cells. The peripheral circuit is further configured to apply, during a program operation of a second memory cell, a second voltage to the first select gate transistor. The second memory cell is coupled to a second word line farther from the first select gate transistor than the first word line. The second voltage is higher than the first voltage.

20 Claims, 14 Drawing Sheets

FIG. 6A

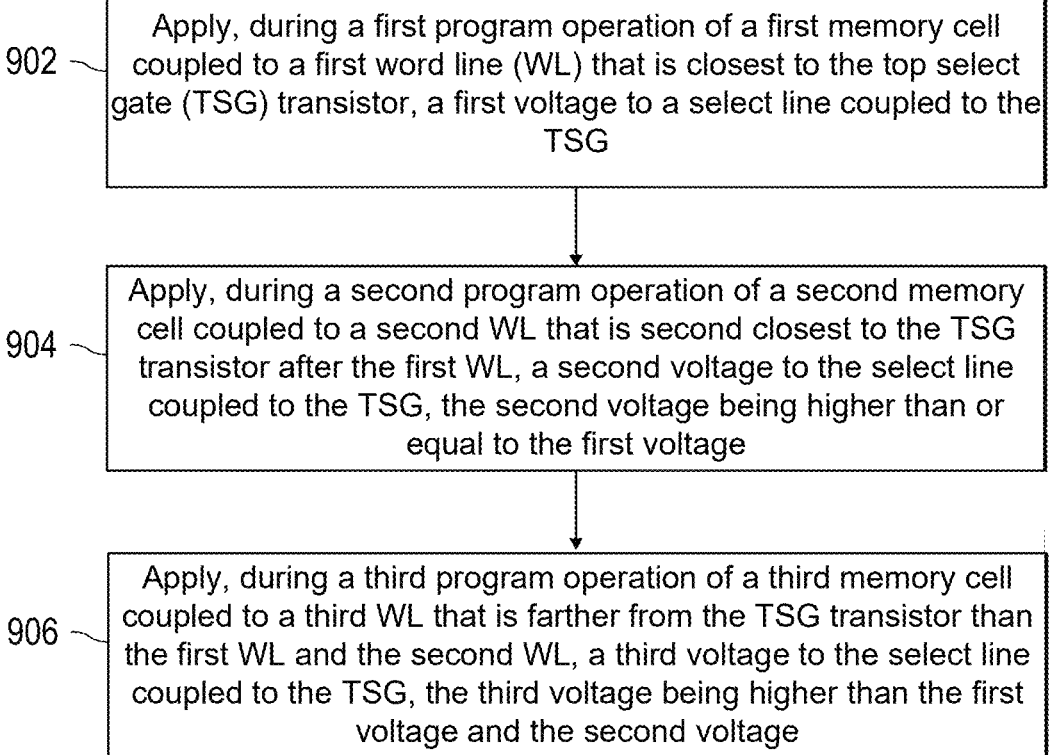

902 ~ Apply, during a first program operation of a first memory cell coupled to a first word line (WL) that is closest to the top select gate (TSG) transistor, a first voltage to a select line coupled to the TSG 904 ~ Apply, during a second program operation of a second memory cell coupled to a second WL that is second closest to the TSG transistor after the first WL, a second voltage to the select line coupled to the TSG, the second voltage being higher than or equal to the first voltage 906 ~ Apply, during a third program operation of a third memory cell coupled to a third WL that is farther from the TSG transistor than the first WL and the second WL, a third voltage to the select line coupled to the TSG, the third voltage being higher than the first voltage and the second voltage

MEMORY
DEVICE

CONTROLLER

1006

1104

1106

1004

MEMORY
DEVICE

MEMORY
DEVICE

MEMORY
DEVICE

MEMORY
DEVICE

MEMORY
DEVICE

MEMORY
DEVICE

CONTROLLER

1006

1108

MANAGING PROGRAM DISTURB IN MEMORY DEVICES

CROSS-REFERENCE TO RELATED APPLICATIONS

This application claims priority to Chinese Patent Application No. 202410479948.3, filed on Apr. 19, 2024, which is hereby incorporated by reference in its entirety.

TECHNICAL FIELD

This present disclosure generally relates to the field of semiconductor technology, and more particularly, to systems and methods for managing program disturb in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, program (write) and erase operations, to change the threshold voltage of each memory cell to a respective level. For NAND flash memory, an erase operation can be performed at the block level, a program operation can be performed at the page level, and a read operation can be performed at the page level.

SUMMARY

The present disclosure involves memory devices, memory systems, and methods for managing program disturb in flash memory. In an example, a memory device can include a memory array and a peripheral circuit. The memory array can include a memory string including a first select gate transistor, a second select gate transistor, and memory cells positioned between the first select gate transistor and the second select gate transistor. The peripheral circuit is configured to apply, during a first program operation of a first memory cell, a first voltage to a select line coupled to the first select gate transistor. The first memory cell is coupled to a first word line that is closest to the first select gate transistor among word lines coupled to the memory cells. The peripheral circuit is further configured to apply, during a second program operation of a second memory cell, a second voltage to the select line coupled to the first select gate transistor. The second memory cell is coupled to a second word line that is farther from the first select gate transistor than the first word line. The second voltage is higher than the first voltage.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 6A illustrates an example of voltages of components in a memory block during programming of the memory block, according to some aspects of the present disclosure.

FIG. 9 illustrates an example of a flow chart of a method for reducing program disturb in a memory device, according to some aspects of the present disclosure.

Like reference numbers and designations in the various drawings indicate like elements.

DETAILED DESCRIPTION

This specification relates to memory devices, memory systems, and methods for managing program disturb in NAND flash memory. A memory device can include one or more memory blocks. Each memory block can include a plurality of memory strings. Each memory string can have a top select gate (TSG) transistor, a bottom select gate (BSG) transistor, and memory cells between the TSG transistor and the BSG transistor. TSG transistors of two or more memory strings can be coupled to the same TSG select line. During a program operation of a selected memory cell in a selected memory string, the memory device can apply a program voltage to a word line coupled to the selected memory cell, and a pass voltage to word lines coupled to the memory cells that are not selected for programming in the selected memory string. Additionally, during the program operation of the selected memory cell in the selected memory string, the memory device can turn on the TSG transistor of the selected memory string, and turn off TSG transistors of deselected memory strings coupled to the same TSG select line as the selected memory string.

Program disturb can occur during the program operation, which can affect the reliability and integrity of the memory device. For example, the TSG transistors in the deselected memory strings may be erroneously turned on due to factors such as coupling effect of the increased voltages of the word lines. Consequently, memory cells in the deselected memory strings, which are not intended to be programmed, may be erroneously programmed due to program disturb.

In some cases, program disturb can be more significant when programming memory cells coupled to word lines that are closer to the TSG transistor of the selected memory string. For example, when the program voltage is applied to a word line that is closer to the TSG transistor of the selected memory string, the TSG transistors of the deselected memory strings are more likely to be erroneously turned on. In some implementations, to mitigate program disturb, when programming memory cells coupled to the two word lines closest to the TSG transistor, the memory device can apply a lower voltage to the TSG select line. When programming memory cells coupled to the rest of the word lines, the memory device can apply a higher voltage to the TSG select line.

Figure 1:
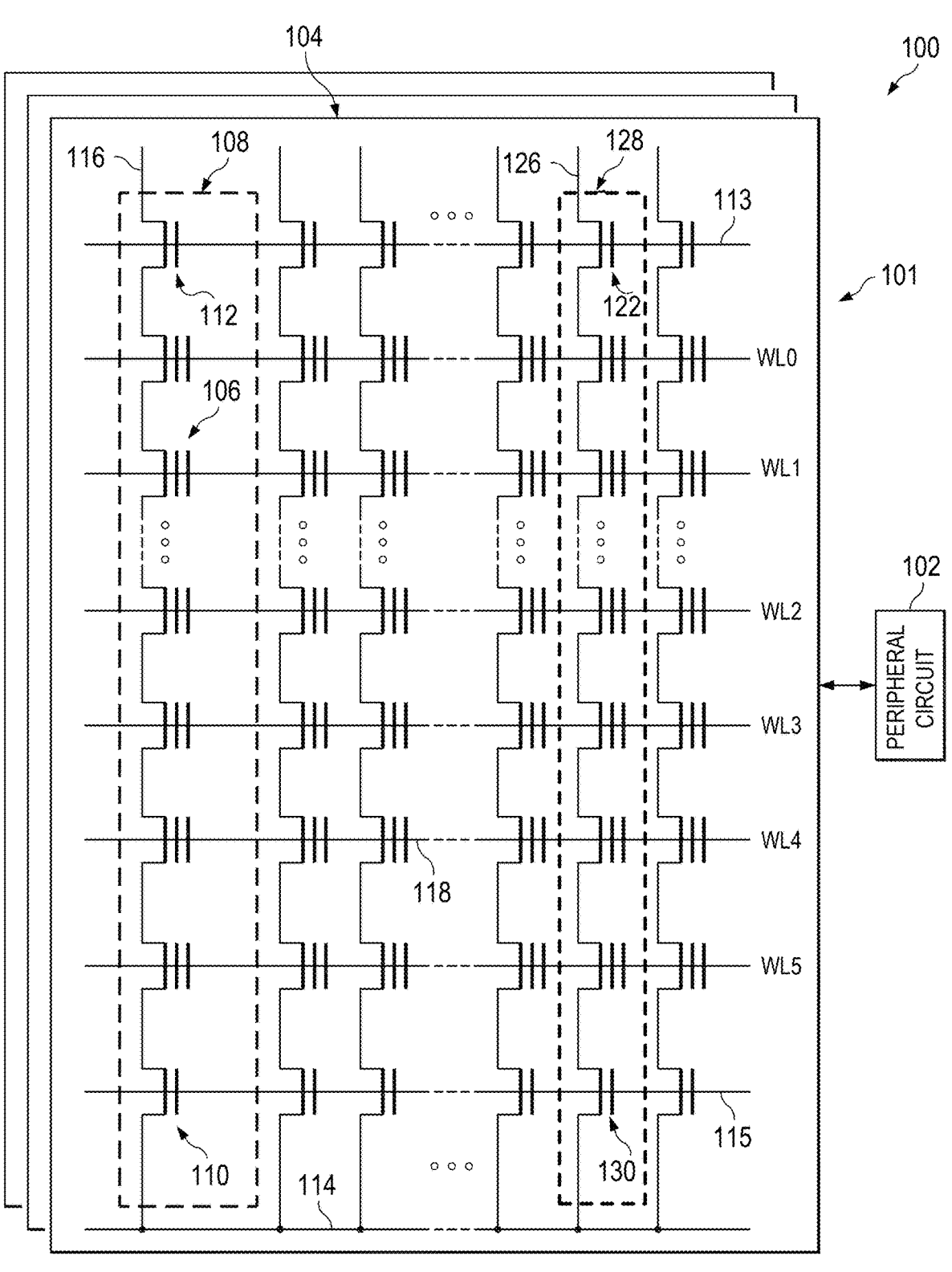
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. The memory device 100 can include a memory cell array 101 and peripheral circuits 102 coupled to the memory cell array 101. The memory cell array 101 can be a NAND Flash memory cell array further includes one or more memory blocks 104. Memory cells 106 are provided in the form of an array of memory strings 108, 128 each extending vertically above a substrate (not shown in FIG. 1). In some implementations, each memory string 108, 128 includes a plurality of memory cells 106 coupled in series and stacked vertically. Each memory cell 106 can hold a continuous, analog value, such as an electrical voltage or charge that depends on the number of electrons trapped within a storage layer of the memory cell 106. The logic state (i.e., data) of each memory cell 106 in the block 104 can be determined based on the threshold voltage Vth of the memory cell 106. Each memory cell 106 can be a floating gate type memory cell including a floating-gate transistor, or a charge trap type memory cell including a charge-trap transistor.

In some implementations, each memory cell 106 is a single-level cell (SLC) with two possible memory states that can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than one bit of data in more than two memory states. For example, the MLC can store two bits per cell, three bits per cell (also known as triple-level cell (TLC)), or four bits per cell (also known as a quad-level cell (QLC)). Each MLC can be programmed to support a range of possible nominal storage values. In one example, if each MLC stores two bits of data, then the MLC can be programmed to one of three possible programming levels from an erased state by writing one of three possible nominal storage values to the cell. A fourth nominal storage value can be used for the erased state.

As shown in FIG. 1, each memory string 108, 128 can include a source select gate (SSG, a.k.a., bottom select gate, BSG) 110, 130 at its source end, and a drain select gate (DSG, a.k.a., top select gate TSG) 112, 122 at its drain end. The SSG 110, 130 and the DSG 112, 122 can be configured to activate selected memory strings 108, 128 (columns of the array) during read and program operations. In some implementations, the sources of memory strings 108, 128 in the same block 104 are coupled through a same source line 114. In other words, memory strings 108, 128 in the same block 104 have an array common source (ACS), according to some implementations. The DSG 112, 122 of each memory string 108, 128 is coupled to a respective bit line 116, 126 from which data can be read or written via an output bus (not shown), according to some implementations. In some implementations, each memory string 108, 128 is configured to be selected or deselected by applying a select voltage (e.g., above the threshold voltage of the transistor having the DSG 112, 122) or a deselect voltage (e.g., 0 V) to the respective DSG 112, 122 through one or more DSG lines 113, and/or by applying a select voltage (e.g., above the threshold voltage of the transistor having the SSG 110, 130) or a deselect voltage (e.g., 0 V) to the respective SSG 110, 130 through one or more SSG lines 115.

As shown in FIG. 1, memory strings 108, 128 can be organized into multiple blocks 104, each of which can have a common source line 114 coupled to the ACS. In some implementations, each block 104 can serve as a basic data unit for erase operations, such that memory cells 106 on the same block 104 are erased at the same time. To erase memory cells 106 in a selected block 104, the source lines 114 coupled to the selected block 104 and unselected blocks in the same plane can be biased with an erase voltage. For example, the erase voltage can be a high positive voltage (e.g., 20 V or more). In some implementations, an erase operation can be performed at a half-block level, a quarter-block level, or a level having any suitable number of blocks or fractions of a block.

The memory cells 106 of adjacent memory strings 108 can be coupled through word lines 118. The word line 118 can select which row of memory cells 106 is affected by read and program operations. In some implementations, the memory cell 106 is a SLC, and each word line 118 is coupled to a page of memory cells 106, which is the basic data unit for program operations. If the memory cell 106 is an MLC that stores two bits of data per cell, each word line 118 can correspond to two pages. If memory cell 106 is a TLC, each word line 118 can correspond to three pages. If memory cell 106 is a QLC, each word line 118 can correspond to four pages. The size of a page in bits is associated with the number of memory strings 108, 128 coupled by word line 118 in a block 104. Each word line 118 can include a gate line coupled to a plurality of control gates (gate electrodes) of a plurality of memory cells 106 in the respective page. Example word lines shown in FIG. 1 include WL0, WL1, WL2, WL3, WL4, and WL5 that are between one or more DSG lines 113 and one or more SSG lines 115. In some implementations, the word lines can further include dummy word lines coupled to dummy memory cells.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies.

Figure 2:
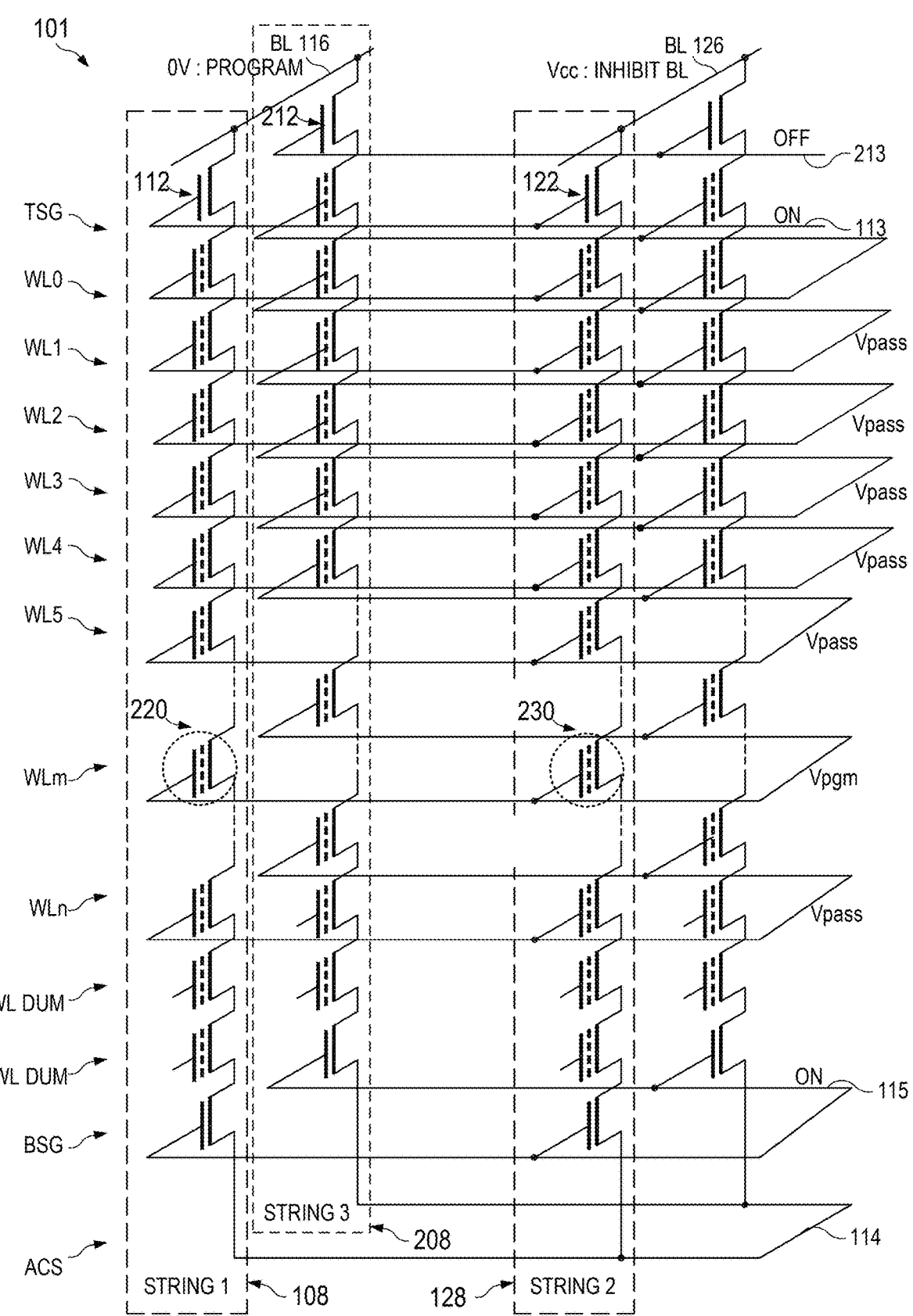
FIG. 2 illustrates an example of a schematic diagram of a memory cell array, according to some aspects of the present disclosure.

FIG. 2 illustrates an example of a schematic diagram of a memory cell array 101, according to some aspects of the present disclosure. In some implementations, the TSG 112 of the memory string 108 (a first memory string) and the TSG 122 of the memory string 128 (a second memory string) are coupled to the same TSG line 113. In addition, TSG 212 of a third memory string 208 (not shown in FIG. 1) can be coupled to another TSG line 213. The first memory string 108 and the third memory string 208 can be coupled to the same bit line 116, and the second memory string can be coupled to a different bit line 126.

In some implementations, the following voltages can be applied to program a selected memory cell 220 in the first memory string 108. First, the memory device can apply a select voltage to the BSG line 115. The BSG transistors of the first memory string 108, the second memory string 128 and the third memory string 208 are turned on. Second, the memory device can apply a select voltage to the TSG line 113 and a deselect voltage to the TSG line 213. Third, the memory device can apply a ground voltage to the bit line 116 to maintain a low voltage in the channel of the transistor having TSG 112. As such, the transistor having TSG 112 is turned on, and the first select memory string 108 is selected for programming. In addition, the memory device can apply an inhibit voltage (e.g., $V_{cc}$) to increase the voltage in the channel of the transistor having TSG 122. The difference between the inhibit voltage and the select voltage applied to TSG 122 through TSG line 113 is smaller than or equal to the threshold voltage of the transistor having the TSG 122. As such, the transistor having TSG 122 is turned off, and the second memory string 128 is deselected for programming. Fourth, the memory device can apply a program voltage $V_{pgm}$ to the word line (e.g., WLm) that is coupled to the selected memory cell 220, and a pass voltage Vpass to other word lines (e.g., WL0-WL5, WLn, and other word lines not shown in FIG. 2). It should be noted that the voltages can be applied concurrently or in any possible order, and do not have to follow the above sequence.

Program disturb can occur during the program operation, which can affect the reliability and integrity of the memory device. For example, memory cells in the second memory string 128 or the third memory string 208, which are not intended to be programmed, may be erroneously programmed due to program disturb. In some implementations, voltage in the channel of the second memory string 128 may rise due to the coupling effect of the increased voltages of the word lines (e.g., WL0-WLn). The voltage increase in the channel of the second memory string 128 can lead to an increase of the voltage of the TSG line 113, which can turn on the transistor having TSG 122 in the second memory string 128. Consequently, the channel of the second memory string 122 can have current leakage through the bit line 126. The current leakage in the bit line 126 can lead to a voltage decrease in the channel of the second memory string 128. Therefore, the memory cell 230 in the second memory string 128 may be programmed by the program voltage $V_{pgm}$ applied to WLm, leading to the issue of program disturb.

In some implementations, program disturb can be more significant when programming memory cells coupled to word lines (e.g., WL0 and WL1) that are closer to the transistors having TSGs 112, 122, than when programming memory cells coupled to word lines (e.g., WL2-WLn) that are further away from the transistors having TSGs 112, 122. For example, the transistor having TSG 122 in the second memory string 128 can be more likely to be erroneously turned on, due to the coupling effect of the increased voltages of the word lines WL0-WLn. In some implementations, to mitigate program disturb, the memory device can apply a lower voltage to the TSG line 113 when programming memory cells coupled to word lines (e.g., WL0 and WL1) that are closer to the transistors having TSGs 112, 122, and apply the normal voltage to the TSG line 113 when programming memory cells coupled to other word lines (e.g., WL2-WLn).

Figure 3:
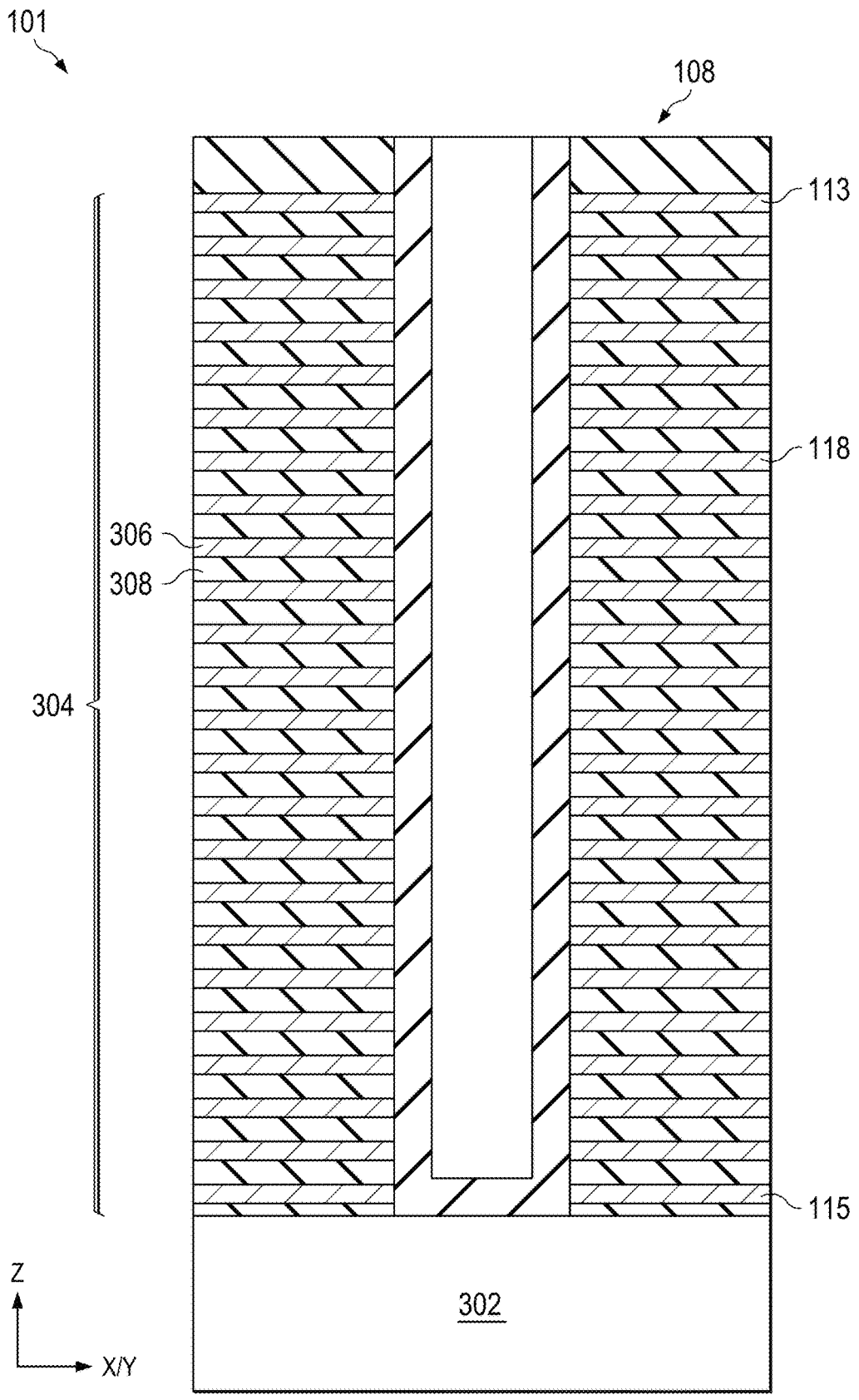
FIG. 3 illustrates an example of a side view of cross-sections of a memory cell array including memory strings, according to some aspects of the present disclosure.

FIG. 3 illustrates an example of a side view of cross-sections of a memory cell array 101 including memory strings 108, according to some aspects of the present disclosure. As shown in FIG. 2, the memory string 108 can extend vertically through a memory stack 304 above a substrate 302. The substrate 302 can include silicon (e.g., single crystalline silicon), silicon germanium (SiGe), gallium arsenide (GaAs), germanium (Ge), silicon on insulator (SOI), germanium on insulator (GOI), or any other suitable materials.

The memory stack 304 can include pairs of interleaved gate conductive layers 306 and gate-to-gate dielectric layers 308. The quantity of the pairs of the interleaved gate conductive layers 306 and gate-to-gate dielectric layers 308 in a memory stack 304 can determine the quantity of memory cells 106 in the memory cell array 101. The gate conductive layer 306 can include conductive materials including, but not limited to, one or more of tungsten (W), cobalt (Co), copper (Cu), aluminum (Al), polysilicon, doped silicon, or silicide. In some implementations, each gate conductive layer 306 includes a metal layer, such as a tungsten layer. In some implementations, each gate conductive layer 306 includes a doped polysilicon layer. Each gate conductive layer 306 can include control gates surrounding the memory cells 106, the DSG 112, or the SSG 110, and can extend laterally as the DSG line 113 at the top of memory stack 304, the SSG line 115 at the bottom of memory stack 304, or the word lines 118 between the DSG line 113 and the SSG line 115.

Figure 4:
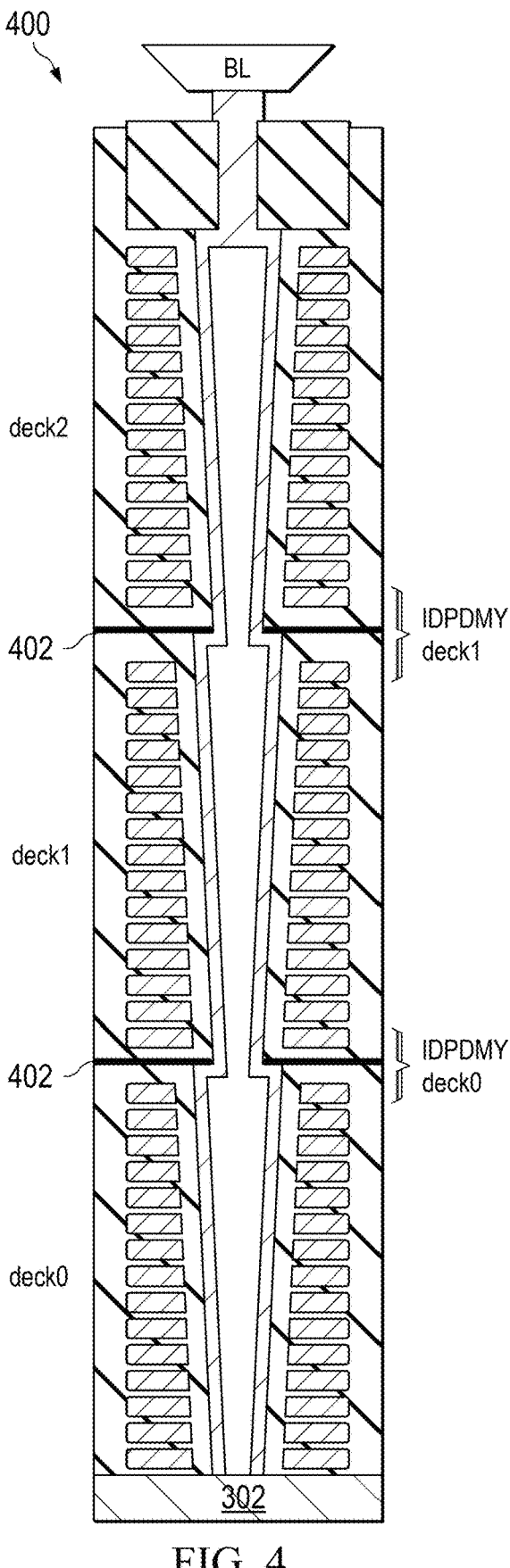
FIG. 4 illustrates an example memory cell stack that includes multiple decks of memory cells, according to some aspects of the present disclosure.

FIG. 4 illustrates an example memory cell stack 400 that includes multiple decks of memory cells, according to some aspects of the present disclosure. Three example decks of memory cells from the top to the bottom of stack 400, i.e., deck2, deck1, and deck0, are shown in FIG. 4. An example of stack 400 is block 104 shown in FIG. 1. Deck2 is positioned above deck1 (e.g., second deck), and deck1 is positioned above deck0. Neighboring decks in FIG. 4 are connected using inter-deck plugs (IDPs) 402. IDPDMY deck1 in FIG. 4 represents dummy word lines in deck1 and deck2 that are adjacent to an IDP that connects deck1 and deck2. IDPDMY deck0 in FIG. 4 represents dummy word lines in deck0 and deck1 that are adjacent to an IDP that connects deck0 and deck1. In some implementations, program operations in the memory cell stack 400 can be performed from top to bottom. That is, memory cells coupled to word lines further away from the substrate 302 are programed before the memory cells coupled to word lines closer to the substrate 302. When memory cells in deck1 are being programmed, memory cells in deck 2 have already been programmed, and memory cells in deck0 are not programmed yet. In other implementations, program operations in the memory cell stack 400 can be performed from bottom to top. That is, memory cells coupled to word lines closer to the substrate 302 is programed before the memory cells coupled to word lines further away from the substrate 302. When memory cells in deck1 are being programmed, memory cells in deck 0 have already been programmed, and memory cells in deck2 are not programmed yet.

Figure 5:
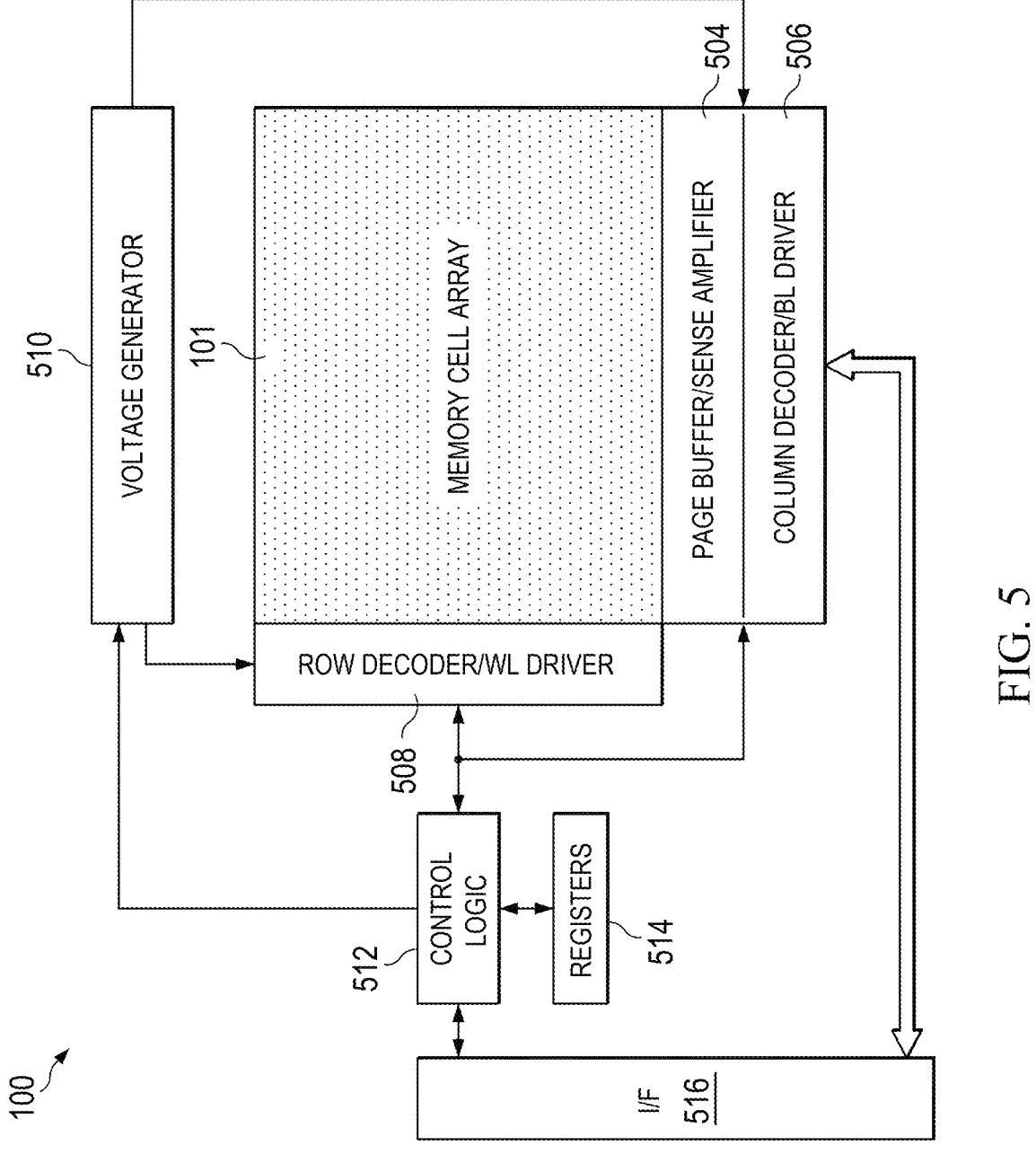
FIG. 5 illustrates some example peripheral circuits, according to some aspects of the present disclosure.

FIG. 5 illustrates some example peripheral circuits, according to some aspects of the present disclosure. The example peripheral circuits include a page buffer/sense amplifier 504, a column decoder/bit line driver 506, a row decoder/word line driver 508, a voltage generator 510, control logic 512, registers 514, an interface 516, and a data bus. In some examples, additional peripheral circuits not shown in FIG. 5 may be included as well.

The page buffer/sense amplifier 504 can be configured to read and program (write) data from and to memory cell array 101 according to the control signals from control logic 512. In an example, the page buffer/sense amplifier 504 may store one page of program data (write data) to be programmed into one page of the memory cell array 101. In another example, the page buffer/sense amplifier 504 may perform program verify operations to ensure that the data has been properly programmed into memory cells 106 coupled to selected word lines 118. In still another example, the page buffer/ sense amplifier 504 may also sense the low power signals from the bit line 116 that represents a data bit stored in memory cell 106, and amplify the small voltage swing to recognizable logic levels in a read operation. The column decoder/bit line driver 506 can be configured to be controlled by the control logic 512 and select one or more memory strings 108 by applying bit line voltages generated from the voltage generator 510.

The row decoder/word line driver 508 can be configured to be controlled by the control logic 512 and select/deselect blocks 104 of the memory cell array 101 and select/deselect word lines 118 of the block 104. The row decoder/word line driver 508 can be further configured to drive word lines 118 using word line voltages generated from the voltage generator 510. In some implementations, the row decoder/word line driver 508 can also select/deselect and drive SSG lines 115 and DSG lines 113. As described below in detail, the row decoder/word line driver 508 is configured to apply a program voltage to selected word line 118 in a program operation on memory cell 106 coupled to selected word line 118.

The voltage generator 510 can be configured to be controlled by the control logic 512 and generate the word line voltages (e.g., read voltage, program voltage, pass voltage, local voltage, verify voltage, etc.), bit line voltages, and source line voltages to be supplied to the memory cell array 101.

The control logic 512 can be coupled to each peripheral circuit described above and configured to control operations of each peripheral circuit. The registers 514 can be coupled to the control logic 512 and include status registers, command registers, and address registers for storing status information, command operation codes (OP codes), and command addresses for controlling the operations of each peripheral circuit.

The interface 516 can be coupled to the control logic 512 and act as a control buffer to buffer and relay control commands received from a host (not shown) to the control logic 512 and status information received from the control logic 512 to the host. The interface 516 can also be coupled to the column decoder/bit line driver 506 via a data bus, and act as a data input/output (I/O) interface and a data buffer to buffer and relay data to and from the memory cell array 101.

Figure 6A:
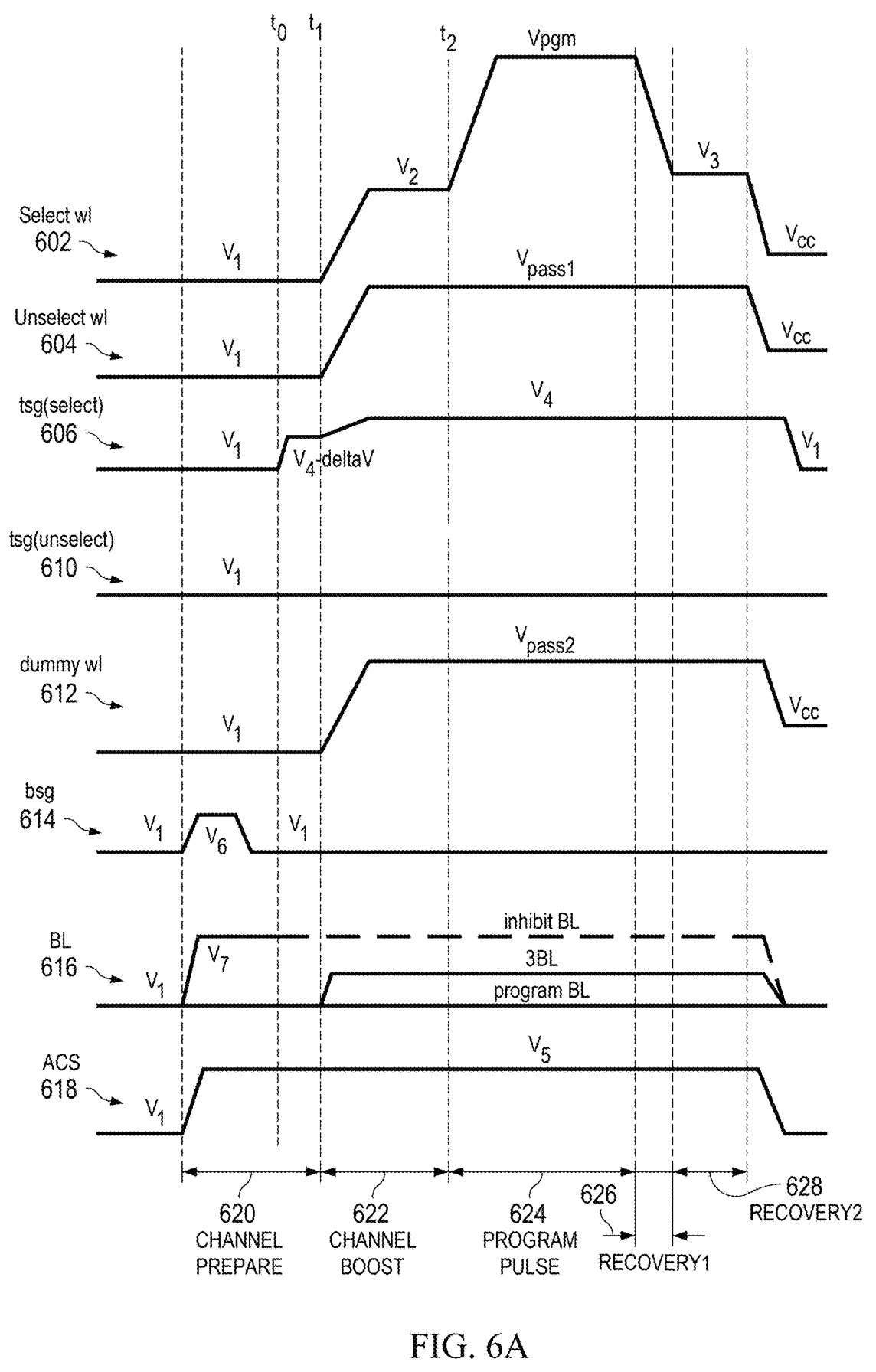

FIG. 6A illustrates an example of voltages of components in a memory cell array during programming of a memory block in the memory cell array, according to some aspects of the present disclosure. In some implementations, select wl 602 represents a word line selected for a program operation (e.g., WLm in FIG. 2). Unselect wl 604 represents a word line not selected for programming, e.g., WL0-WL5 or WLn in FIG. 2. Tsg (select) 606 represents a selected TSG line (e.g., TSG line 113 in FIG. 2 coupled to TSG 112 and TSG 122). Tsg (unselect) 610 represents a TSG line that is turned off (e.g., TSG line 213 in FIG. 2). Dummy wl 612 represents a dummy word line in the memory block (e.g., WL DUM in FIG. 2). Bsg 614 represents a BSG line (e.g., BSG line 115 in FIG. 1 coupled to BSG 110 and BSG 130). BL 616 represents a bit line in the memory block (e.g., bit lines 116, 126 in FIG. 2). BL 616 can represent one of three types of bit line: a program bit line (program BL) representing a bit line (e.g., bit line 116 in FIG. 2) of a memory string (e.g., the first memory string 108 in FIG. 2) selected for a program operation, a bit line with intermediate voltage (3BL), and an inhibit bit line (inhibit BL) representing a bit line (e.g., bit line 126 in FIG. 2) of a memory string (e.g., the second memory string 128 in FIG. 2) deselected for a program operation. ACS 618 represents a source line (e.g., source line 114 in FIG. 1), coupled to all memory strings in the memory block.

In some implementations, the program operation can include a channel prepare phase 620, a channel boost phase 622, a program pulse phase 624, a first recovery phase 626 and a second recovery phase 628. For example, the voltages shown in FIG. 6A can represent voltages during program pulses in a later portion of an incremental step pulse programming (ISPP) scheme. For example, for an ISPP scheme with 16 program pulses, program operations using the last 10 pulses can be performed using the voltages shown in FIG. 4A. Since the last 10 pulses have higher voltages than the first 6 pulses and can lead to larger disturb during the program operation, the channel prepare phase 620 can include a channel pre-charge operation. The channel pre-charge operation can pre-charge the channels of the memory string selected for programming (e.g., the first memory string 108 in FIG. 2) and the channels of the memory strings not selected for programming (e.g., the second memory string 128 and the third memory string 208 in FIG. 2). In some implementations, the program operations in the memory block 104 are performed from top to bottom. Voltage of ACS 618 is used to pre-charge the channels through the control of voltage of bsg 614 in the top-to-bottom programming operations.

In some implementations, the channel pre-charge operation is performed at the beginning (i.e., before $t_0$) of the channel prepare phase 620. To perform the channel pre-charge operation, the voltage of ACS 618 increases from $V_1$ (e.g., 0V) to $V_5$ (e.g., 2V). In addition, a voltage $V_6$ (e.g., 5V) can be applied to bsg 614 to turn on transistors coupled to bsg 614, in order to connect the channels of the memory strings (e.g., the memory strings 108, 128, 208 in FIG. 2) to ACS 618. After performing the pre-charge operation, the voltage of bsg 614 decreases from $V_6$ to $V_1$, and stays at $V_1$ until the end of the second recovery phase 628. The voltage of ACS 618 can stay at $V_5$ until the end of the second recovery phase 628.

In some implementations, after the channel pre-charge operation (i.e., after $t_0$) and during the channel prepare phase 620, the voltage of tsg (select) 606 increases from $V_1$ to $V_4$ (e.g., 3V, such that the voltage of tsg (select) 606 is larger than the threshold voltage of the TSG transistors), and stays at $V_4$ until the end of the second recovery phase 628. In other implementations, as shown in FIG. 6A, the voltage of tsg (select) 606 can increase to $V_4$ in a two-step method. First, from to during the channel prepare phase 620, the voltage of tsg (select) 606 can increase from $V_1$ to a voltage (i.e., $V_4$-deltaV) between $V_1$ and $V_4$. Second, from the beginning of the channel boost phase 622, the voltage of tsg (select) 606 can increase from $V_4$-deltaV to $V_4$. In some implementations, the two-step method can help reduce the program disturb in the memory string not selected for programming.

In some implementations, the voltage of tsg (unselect) 610 stays at $V_1$ from the beginning of the channel prepare phase 620 to the end of the second recovery phase 628.

In some implementations, from the beginning (i.e., $t_1$) of the channel boost phase 622, the voltage of select wl 602 increases from $V_1$ to $V_2$ (e.g., 6.5V). From the beginning (i.e., $t_2$) of the program pulse phase 624, the voltage of select wl 602 increases from $V_2$ to $V_{pgm}$ (e.g., between 10V and 20V). From the beginning of the first recovery phase 626, the voltage of select wl 602 decreases from $V_{pgm}$ to $V_3$ (e.g., 8V). During the second recovery phase 628, the voltage of select wl 602 can stay at $V_3$. After the second recovery phase 628, the voltage of select wl 602 can decrease from $V_3$ to a power supply voltage $V_{cc}$ (e.g., 2V). In some implementations, when a specific voltage is applied to a line at a specific time, due to the loading effect associated with the line, it may take some time before the voltage of the line ramps up to that specific voltage. For example, when $V_2$ is applied to select wl 602 at $t_1$, it may take some time for the voltage of select wl 602 to increase from $V_1$ to $V_2$, as shown in FIG. 6A. In other implementations, the voltage of the line can instantly reach the applied voltage.

In some implementations, from the beginning (i.e., $t_1$) of the channel boost phase 622, the voltage of unselect wl 604 increases from $V_1$ to a pass voltage $V_{pass1}$ (e.g., 5V). The voltage of unselect wl 604 can stay at $V_{pass1}$ until the end of the second recovery phase 628, and can decrease to $V_{cc}$ after the second recovery phase 628.

In some implementations, from the beginning (i.e., $t_1$) of the channel boost phase 622, the voltage of dummy wl 612 increases from $V_1$ to a pass voltage $V_{pass2}$ (e.g., 5V). The voltage of dummy wl 612 stays at $V_{pass2}$ until the end of the second recovery phase 628, and can decrease to $V_{cc}$ after the second recovery phase 628.

In some implementations, from the beginning of the channel prepare phase 620, the voltage of inhibit BL in BL 616 increases from $V_1$ to $V_7$ (e.g., 2V). The difference between the voltage (i.e., $V_4$) of tsg (select) 606 during the program pulse phase 620 and $V_7$ is smaller than or equal to the threshold voltage of the TSG transistors coupled to the tsg (select) 606. The voltage of program BL in BL 616 stays at $V_1$ from the beginning of the channel prepare phase 620 to the end of the second recovery phase 628. From the beginning ($t_1$) of the channel boost phase 622, the voltage of 3BL in BL 616 can increase from $V_1$ to an intermediate voltage between $V_1$ and $V_7$.

Figure 6B:
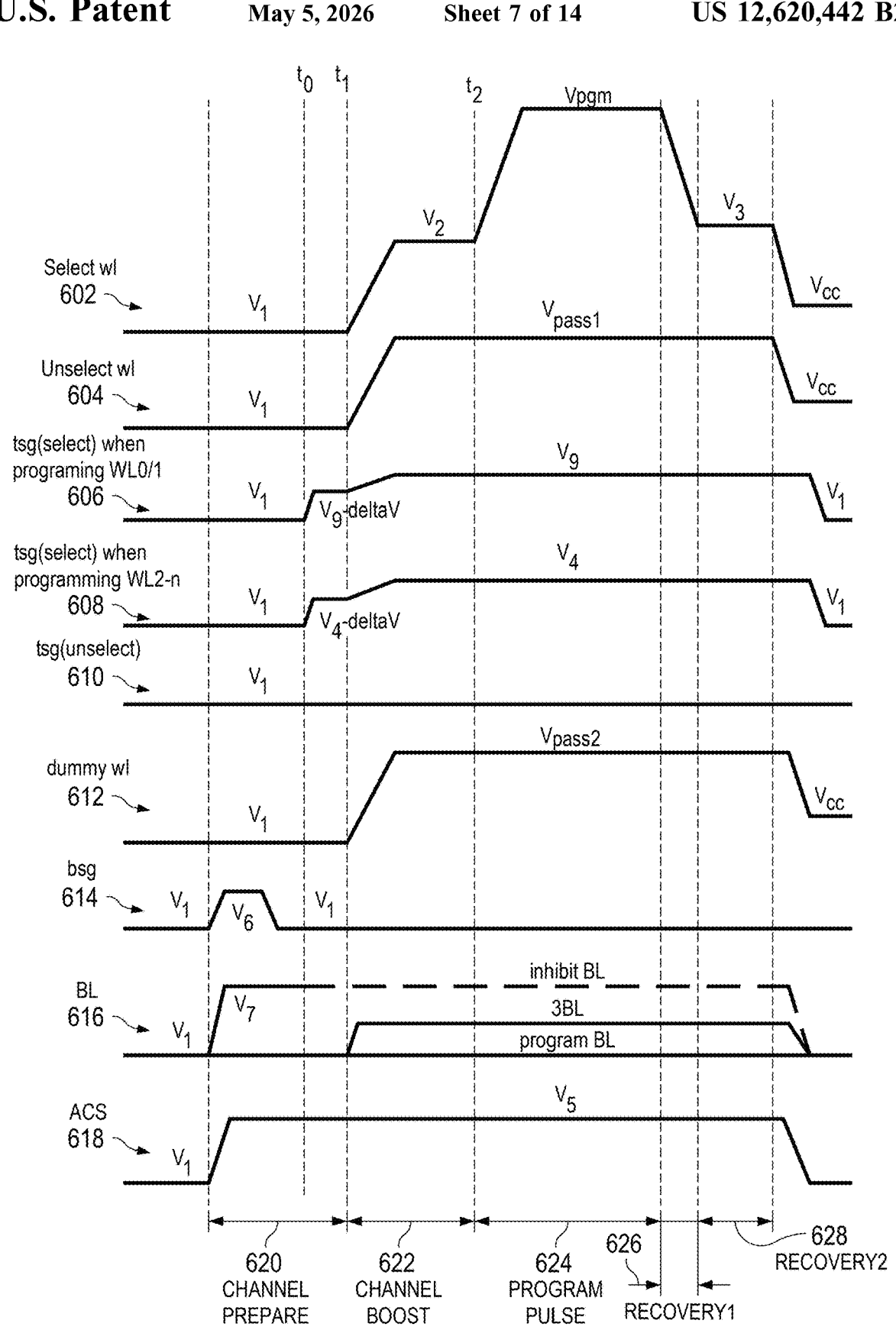
FIG. 6B illustrates another example of voltages of components in a memory block during programming of the memory block, according to some aspects of the present disclosure.

FIG. 6B illustrates an example of voltages of components in a memory cell array during programming of a memory block in the memory cell array, according to some aspects of the present disclosure. Voltage conditions of most components of the memory block, for example, select wl 602, unselect wl 604, tsg (unselect) 610, dummy wl 612, bsg 614, BL 616, and ACS 618, are identical to those in FIG. 6A, except for tsg (select) 606, 608. As explained with reference to FIG. 2, to mitigate program disturb, the memory device can apply a lower voltage to tsg (select) 606 when programming memory cells coupled to word lines (e.g., WL0 and WL1) that are closer to the TSG transistors, and apply a higher voltage to tsg (select) 608 when programming memory cells coupled to other word lines (e.g., WL2-WLn).

In some implementations, in a program operation to program memory cells coupled to one of the word lines WL2-WLn, after the channel pre-charge operation (i.e., after $t_0$) and during the channel prepare phase 620, the voltage of tsg (select) 608 increases from $V_1$ to $V_4$ (e.g., 3V, such that the voltage of tsg (select) 608 is higher than the threshold voltage of the TSG transistors coupled to the tsg (select) 708). The voltage of tsg (select) 608 can stay at $V_4$ until the end of the second recovery phase 628. In other implementations, the voltage of tsg (select) 608 can increase to $V_4$ in a two-step method. First, from to during the channel prepare phase 620, the voltage of tsg (select) 608 can increase from $V_1$ to a voltage (i.e., $V_4$-deltaV) between $V_1$ and $V_4$. Second, after to during the channel prepare phase 620 and before the start of the program pulse phase 624, the voltage of tsg (select) 608 can increase from $V_4$-deltaV to $V_4$.

In some implementations, in a program operation to program memory cells coupled to WL0 or WL1, after the channel pre-charge operation (i.e., after $t_0$) and during the channel prepare phase 620, the voltage of tsg (select) 606 increases from $V_1$ to $V_9$ (e.g., 2.5-2.9V, such that the voltage of tsg (select) 606 is still higher than the threshold voltage of the TSG transistors coupled to the tsg (select) line). The voltage of tsg (select) 606 can stay at $V_9$ until the end of the second recovery phase 628. $V_9$ is lower than $V_4$. In other implementations, the voltage of tsg (select) 606 can increase to $V_9$ in a two-step method. First, from to during the channel prepare phase 620, the voltage of tsg (select) 606 can increase from $V_1$ to a voltage (i.e., $V_9$-deltaV) between $V_1$ and $V_9$. Second, after to during the channel prepare phase 620 and before the start of the program pulse phase 624, the voltage of tsg (select) 608 can increase from $V_9$-deltaV to $V_9$.

In some implementations, the voltage of tsg (select) 606 when programming memory cells coupled to WL0 can be the same as the voltage of tsg (select) 606 when programming memory cells coupled to WL1. In other implementations, the voltage of tsg (select) 606 when programming memory cells coupled to WL0 is lower than the voltage of tsg (select) 606 when programming memory cells coupled to WL1. For example, in a program operation to program memory cells coupled to WL0, after the channel pre-charge operation (i.e., after $t_0$) and before the program pulse phase 624, the voltage of tsg (select) 606 increases from $V_1$ to $V_9$. In a program operation to program memory cells coupled to WL1, after the channel pre-charge operation (i.e., after $t_0$) and before the program pulse phase 624, the voltage of tsg (select) 606 increases from $V_1$ to $V_{10}$. $V_{10}$ is higher than $V_9$ and lower than $V_4$.

In some implementations, a predetermined threshold is used to divide the word lines into two groups. The first group of word lines are closer to the TSG transistor than the second group of word lines. For example, the predetermined threshold can be set as 2. The first group of word lines can include WL0 and WL1, and the second group of word lines can include WL2-WLn. When programming memory cells coupled to WL0 and WL1, the voltage applied to tsg (select) 606 can be a lower voltage $V_9$. When programming memory cells coupled to WL2-WLn, the voltage applied to tsg (select) 608 can be a higher voltage $V_4$. For another example, the predetermined threshold can be set as 3. The first group of word lines can include WL0, WL1 and WL2, and the second group of word lines can include WL3-WLn. When programming memory cells coupled to WL0, WL1 and WL2, the voltage applied to tsg (select) 606 can be a lower voltage $V_9$. When programming memory cells coupled to WL3-WLn, the voltage applied to tsg (select) 608 can be a higher voltage $V_4$. It should be noted that the word lines can be grouped based on other suitable predetermined thresholds.

Figure 7A:
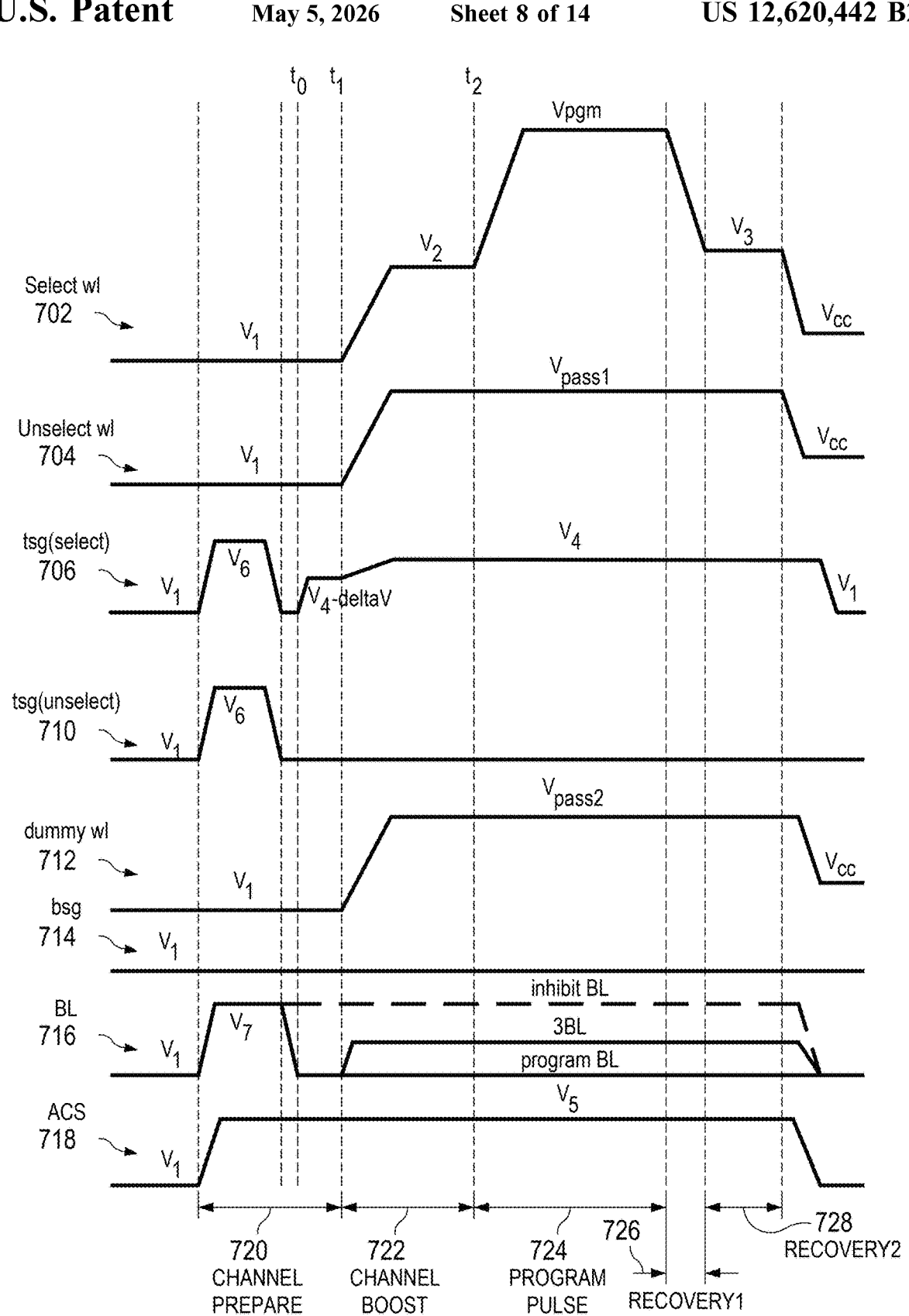
FIG. 7A illustrates another example of voltages of components in a memory block during programming of the memory block, according to some aspects of the present disclosure.

FIG. 7A illustrates another example of voltages of components in a memory cell array during programming of a memory block in the memory cell array, according to some aspects of the present disclosure. In some implementations, the program operation can include a channel prepare phase 720, a channel boost phase 722, a program pulse phase 724, a first recovery phase 726 and a second recovery phase 728. Similar to FIG. 6A, the voltages shown in FIG. 7A can represent voltages during program pulses in a later portion of the ISPP scheme, for example, the last 10 pulses of an ISPP scheme with 16 program pulses. The channel prepare phase 720 can also include a channel pre-charge operation. Different from FIG. 6A, which illustrates voltages for program operations from top to bottom, in FIG. 7A the program operations in the memory block 104 can be performed from bottom to top. Voltage of BL 716 is used to pre-charge the channels through the control of voltage of tsg (select) 706 and tsg (unselect) 710 in the bottom-to-top programming operations.

As shown in FIG. 7A, voltages during the channel prepare phase 720 can be different from the voltages as shown in FIG. 6A. Specifically, the voltages of tsg (select) 706, tsg (unselect) 710, bsg 714, and BL 716 can be different from the respective voltages shown in FIG. 6A. In order to perform the channel pre-charge operation, the voltage of BL 716 increases from $V_1$ to $V_7$ from the beginning of the channel prepare phase 720. In addition, a voltage $V_6$ can be applied to tsg (select) 706 and tsg (unselect) 710 at the beginning of the channel prepare phase 720. As such, by turning on transistors coupled to tsg (select) 706 and tsg (unselect) 710, the channels of the memory strings (e.g., the memory strings 108, 128, 208 in FIG. 2) are connected to respective bit lines (e.g., bit lines 116, 126 in FIG. 2). After performing the pre-charge operation and before to, the voltages of tsg (select) 706 and tsg (unselect) 710 decrease to $V_1$.

The voltage of bsg 714 can stay at $V_1$ from the beginning of the channel prepare phase 720 to the end of the second recovery phase 728.

Figure 7B:
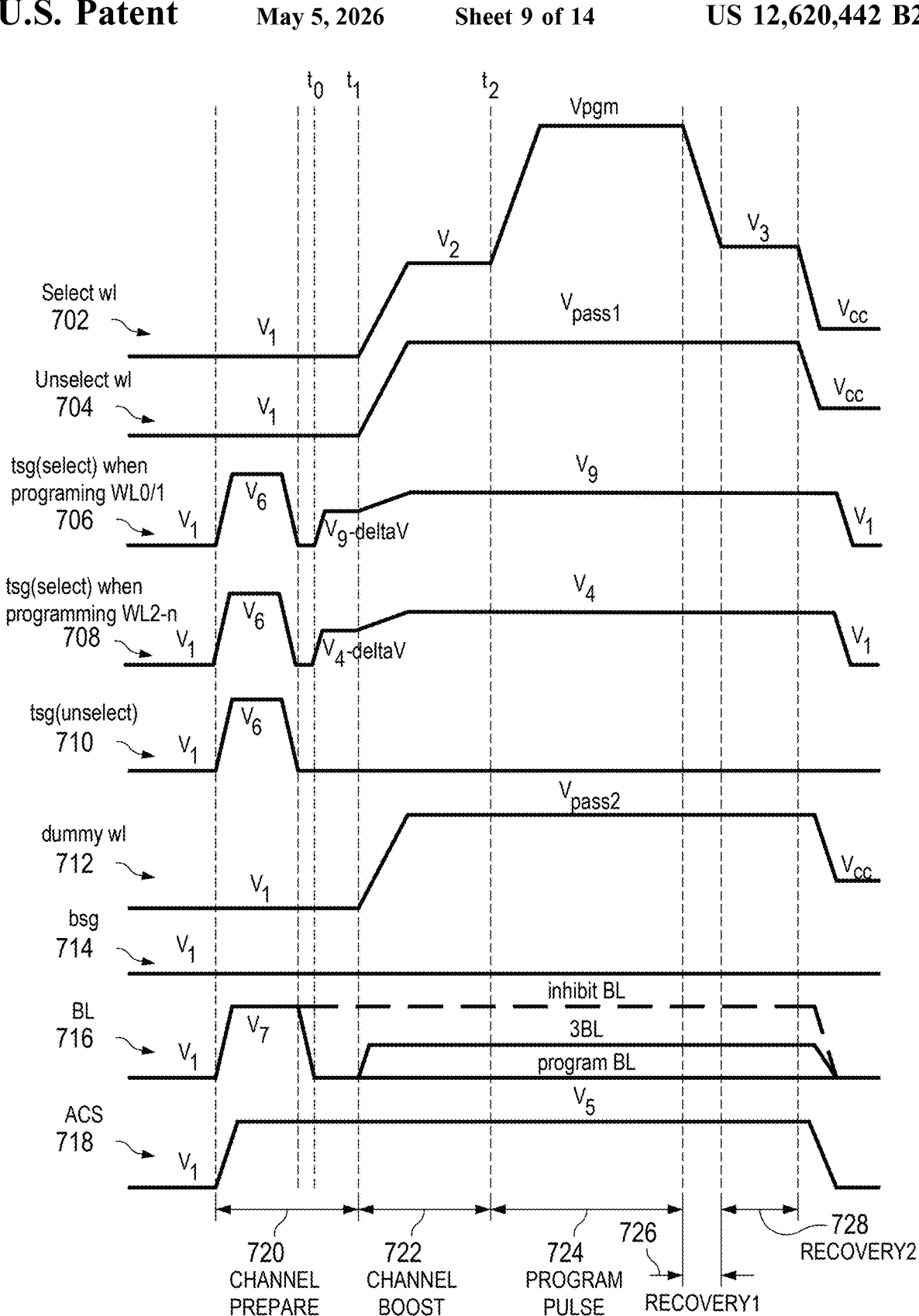
FIG. 7B illustrates another example of voltages of components in a memory block during programming of the memory block, according to some aspects of the present disclosure.

FIG. 7B illustrates another example of voltages of components in a memory block during programming of the memory block, according to some aspects of the present disclosure. Voltage conditions of most components of the memory block, for example, select wl 702, unselect wl 704, tsg (unselect) 710, dummy wl 712, bsg 714, BL 716, and ACS 718, are identical to those in FIG. 7A, except for tsg (select) 706, 708 after to. As explained with reference to FIG. 2, to mitigate program disturb, the memory device can apply a lower voltage to tsg (select) 706 when programming memory cells coupled to word lines (e.g., WL0 and WL1) that are closer to the TSG transistor, and apply a higher voltage to tsg (select) 708 when programming memory cells coupled to other word lines (e.g., WL2-WLn).

In some implementations, in a program operation to program memory cells coupled to WL2-WLn, after the channel pre-charge operation (i.e., after $t_0$) and during the channel prepare phase 720, the voltage of tsg (select) 708 increases from $V_1$ to $V_4$ (e.g., 3V, such that the voltage of tsg (select) 708 is higher than the threshold voltage of the TSG transistors coupled to the tsg (select) 708). The voltage of tsg (select) 708 can stay at $V_4$ until the end of the second recovery phase 728. In other implementations, the voltage of tsg (select) 708 can increase to $V_4$ in a two-step method. First, from to during the channel prepare phase 720, the voltage of tsg (select) 708 can increase from $V_1$ to a voltage (i.e., $V_4$-deltaV) between $V_1$ and $V_4$. Second, after to during the channel prepare phase 720 and before the start of the program pulse phase 724, the voltage of tsg (select) 708 can increase from $V_4$-deltaV to $V_4$.

In some implementations, in a program operation to program memory cells coupled to WL0 or WL1, after the channel pre-charge operation (i.e., after $t_0$) and during the channel prepare phase 720, the voltage of tsg (select) 706 increases from $V_1$ to $V_9$ (e.g., 2.5-2.9V, such that the voltage of tsg (select) 706 is still higher than the threshold voltage of the TSG transistors coupled to the tsg (select) 706). $V_9$ is lower than $V_4$. The voltage of tsg (select) 706 can stay at $V_9$ until the end of the second recovery phase 728. In other implementations, the voltage of tsg (select) 706 can increase to $V_9$ in a two-step method. First, from to during the channel prepare phase 720, the voltage of tsg (select) 706 can increase from $V_1$ to a voltage (i.e., $V_9$-deltaV) between $V_1$ and $V_9$. Second, after to during the channel prepare phase 720 and before the start of the program pulse phase 724, the voltage of tsg (select) 708 can increase from $V_9$-deltaV to $V_9$.

In some implementations, the voltage of tsg (select) 706 when programming memory cells coupled to WL0 can be the same as the voltage of tsg (select) 706 when programming memory cells coupled to WL1. In other implementations, the voltage of tsg (select) 706 when programming memory cells coupled to WL0 is lower than the voltage of tsg (select) 706 when programming memory cells coupled to WL1. For example, in a program operation to program memory cells coupled to WL0, after the channel pre-charge operation (i.e., after $t_0$) and before the program pulse phase 724, the voltage of tsg (select) 706 increases from $V_1$ to $V_9$. In a program operation to program memory cells coupled to WL1, after the channel pre-charge operation (i.e., after $t_0$) and before the program pulse phase 724, the voltage of tsg (select) 706 increases from $V_1$ to $V_{10}$. $V_{10}$ is higher than $V_9$ and lower than $V_4$.

In some implementations, a predetermined threshold is used to divide the word lines into two groups. The first group of word lines are closer to the TSG transistor than the second group of word lines. For example, the predetermined threshold can be set as 2. The first group of word lines can include WL0 and WL1, and the second group of word lines can include WL2-WLn. When programming memory cells coupled to WL0 and WL1, the voltage applied to tsg (select) 606 can be a lower voltage $V_9$. When programming memory cells coupled to WL2-WLn, the voltage applied to tsg (select) 608 can be a higher voltage $V_4$. For another example, the predetermined threshold can be set as 3. The first group of word lines can include WL0, WL1 and WL2, and the second group of word lines can include WL3-WLn. When programming memory cells coupled to WL0, WL1 and WL2, the voltage applied to tsg (select) 606 can be a lower voltage $V_9$. When programming memory cells coupled to WL3-WLn, the voltage applied to tsg (select) 608 can be a higher voltage $V_4$. It should be noted that the word lines can be grouped based on other suitable predetermined thresholds.

Figure 8A:
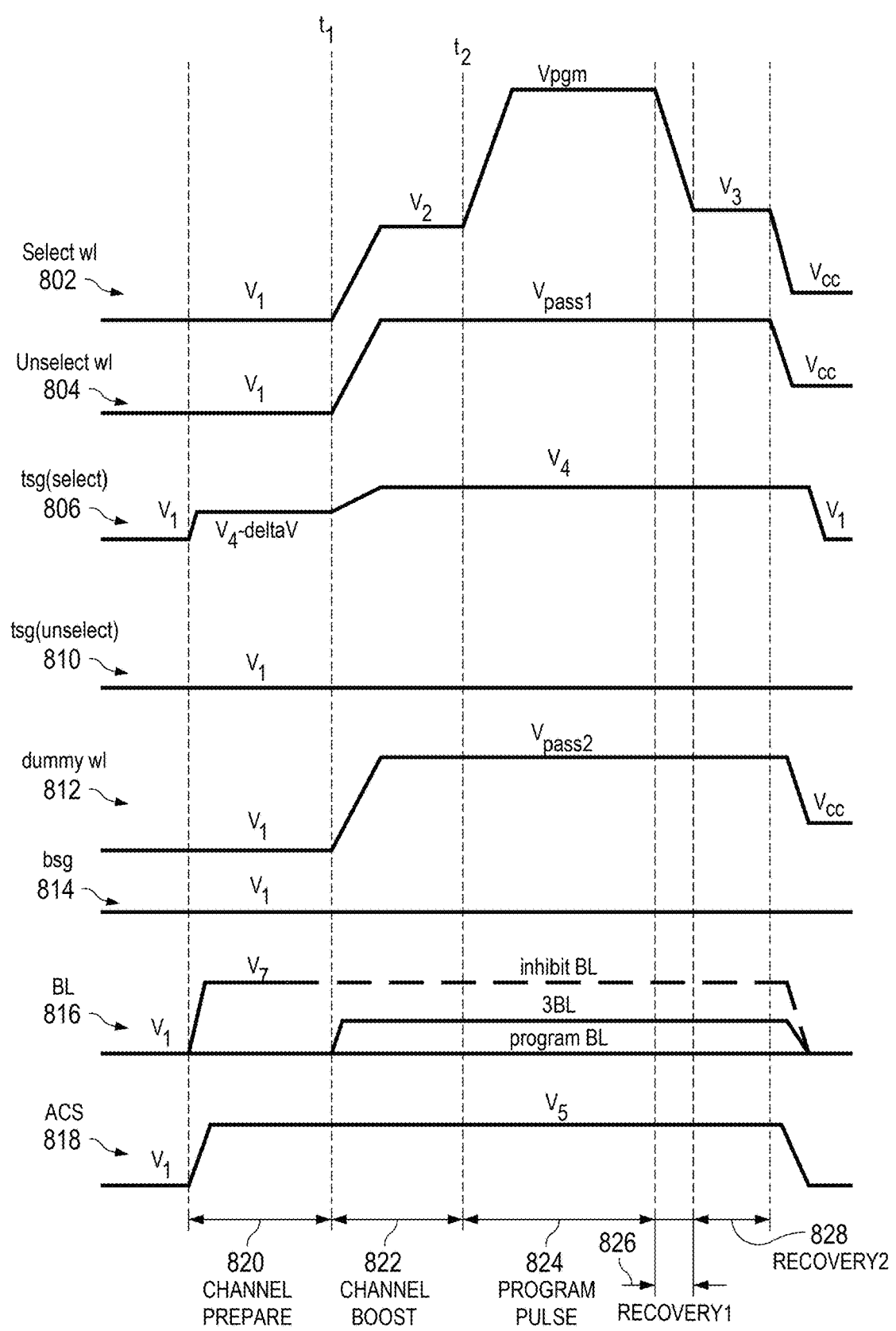
FIG. 8A illustrates another example of voltages of components in a memory block during programming of the memory block, according to some aspects of the present disclosure.

FIG. 8A illustrates another example of voltages of components in a memory cell array during programming of a memory block in the memory cell array, according to some aspects of the present disclosure. In some implementations, the program operation can include a channel prepare phase 820, a channel boost phase 822, a program pulse phase 824, a first recovery phase 826 and a second recovery phase 828. Different from FIG. 6A, the voltages shown in FIG. 8A can represent voltages during program pulses in an earlier portion of the ISPP scheme. For example, for an ISPP scheme with 16 program pulses, program operations using the first 6 pulses can be performed using the voltages shown in FIG. 8A. Since the first 6 pulses have lower voltages than the last 10 pulses, the disturb during the program operation is less severe, and the channel pre-charge operation may not be performed during the channel prepare phase 820. In some implementations, since the channel pre-charge operation is not performed, voltages as shown in FIG. 8A can be applied to both program operations in a top-to-bottom order and program operations in a bottom-to-top order.

As shown in FIG. 8A, voltage conditions of most components of the memory block, for example, select wl 802, unselect wl 804, tsg (unselect) 810, dummy wl 812, BL 816, and ACS 818, are identical to those in FIG. 6A, except for tsg (select) 806, and bsg 814.

In some implementations, the voltage of tsg (select) 806 increases from $V_1$ to $V_4$ from the beginning of the channel prepare phase 820. In other implementations, the voltage of tsg (select) 806 increases from $V_1$ to $V_4$ in a two-step method. For example, the voltage of tsg (select) 806 first increases from $V_1$ to $V_4$-deltaV from the beginning of the channel prepare phase 820, and then increases from $V_4$-deltaV to $V_4$ before the program pulse phase 824 starts.

In some implementations, the voltage of bsg 814 stays at $V_1$ from the beginning of the channel prepare phase 820 to the end of the second recovery phase 828.

Figure 8B:
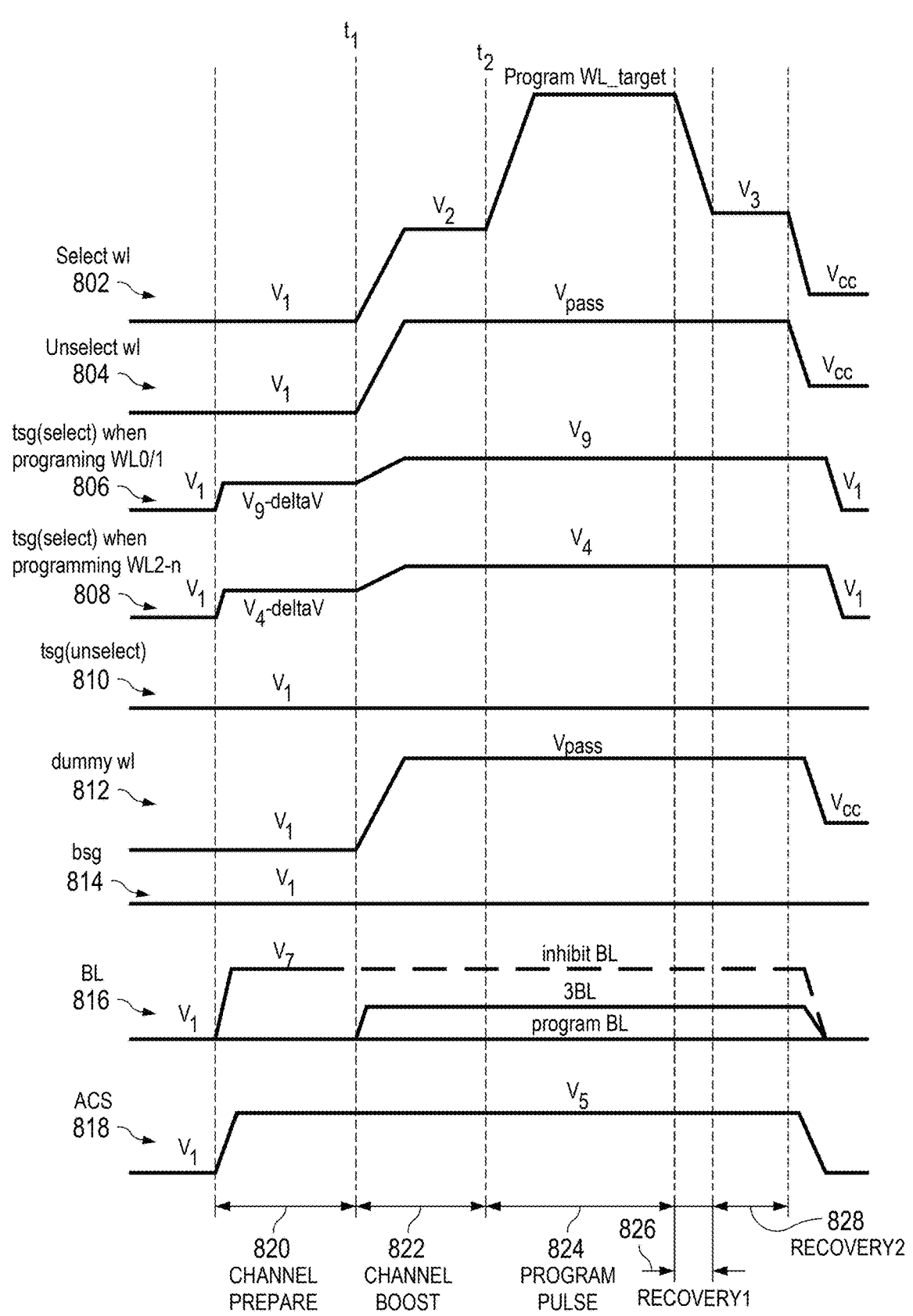
FIG. 8B illustrates another example of voltages of components in a memory block during programming of the memory block, according to some aspects of the present disclosure.

FIG. 8B illustrates another example of voltages of components in a memory block during programming of the memory block, according to some aspects of the present disclosure. Voltage conditions of most components of the memory block, for example, select wl 802, unselect wl 804, tsg (unselect) 810, dummy wl 812, bsg 814, BL 816, and ACS 81w8, are identical to those in FIG. 8A, except for tsg (select) 806, 808. As explained with reference to FIG. 2, to mitigate program disturb, the memory device can apply a lower voltage to tsg (select) 806 when programming memory cells coupled to word lines (e.g., WL0 and WL1) that are closer to the TSG transistors, and apply a higher voltage to tsg (select) 808 when programming memory cells coupled to other word lines (e.g., WL2-WLn).

In some implementations, in a program operation to program memory cells coupled to WL2-WLn, from the beginning of the channel prepare phase 820, the voltage of tsg (select) 808 increases from $V_1$ to $V_4$, and stays at $V_4$ until the end of the second recovery phase 828. In other implementations, the voltage of tsg (select) 808 can increase to $V_4$ in a two-step method. First, from the beginning of the channel prepare phase 820, the voltage of tsg (select) 808 can increase from $V_1$ to a voltage (i.e., $V_4$-deltaV) between $V_1$ and $V_4$. Second, after the channel prepare phase 820 before the start of the program pulse phase 824, the voltage of tsg (select) 808 can increase from $V_4$-deltaV to $V_4$.

In some implementations, in a program operation to program memory cells coupled to WL0 or WL1, from the beginning of the channel prepare phase 820, the voltage of tsg (select) 806 increases from $V_1$ to $V_9$, and stays at $V_9$ until the end of the second recovery phase 828. $V_9$ is lower than $V_4$. In other implementations, the voltage of tsg (select) 806 can increase to $V_9$ in a two-step method. First, from the beginning of the channel prepare phase 820, the voltage of tsg (select) 806 can increase from $V_1$ to a voltage (i.e., $V_9$-deltaV) between $V_1$ and $V_9$. Second, after the channel prepare phase 820 before the start of the program pulse phase 824, the voltage of tsg (select) 806 can increase from $V_9$-deltaV to $V_9$.

In some implementations, the voltage of tsg (select) 806 when programming memory cells coupled to WL0 can be the same as the voltage of tsg (select) 806 when programming memory cells coupled to WL1. In other implementations, the voltage of tsg (select) 806 when programming memory cells coupled to WL0 is lower than the voltage of tsg (select) 806 when programming memory cells coupled to WL1. For example, in a program operation to program memory cells coupled to WL0, after the channel pre-charge operation (i.e., after $t_0$) and before the program pulse phase 824, the voltage of tsg (select) 806 increases from $V_1$ to $V_9$. In a program operation to program memory cells coupled to WL1, after the channel pre-charge operation (i.e., after $t_0$) and before the program pulse phase 824, the voltage of tsg (select) 806 increases from $V_1$ to $V_{10}$. $V_{10}$ is higher than $V_9$ and lower than $V_4$.

In some implementations, a predetermined threshold is used to divide the word lines into two groups. The first group of word lines are closer to the TSG transistor than the second group of word lines. For example, the predetermined threshold can be set as 2. The first group of word lines can include WL0 and WL1, and the second group of word lines can include WL2-WLn. When programming memory cells coupled to WL0 and WL1, the voltage applied to tsg (select) 606 can be a lower voltage $V_9$. When programming memory cells coupled to WL2-WLn, the voltage applied to tsg (select) 608 can be a higher voltage $V_4$. For another example, the predetermined threshold can be set as 3. The first group of word lines can include WL0, WL1 and WL2, and the second group of word lines can include WL3-WLn. When programming memory cells coupled to WL0, WL1 and WL2, the voltage applied to tsg (select) 606 can be a lower voltage $V_9$. When programming memory cells coupled to WL3-WLn, the voltage applied to tsg (select) 608 can be a higher voltage $V_4$. It should be noted that the word lines can be grouped based on other suitable predetermined thresholds.

FIG. 9 illustrates an example of a flow chart of a method for managing program disturb in a memory device, according to some aspects of the present disclosure. The memory device can include a memory array that includes a first memory string. The memory string can include a top select gate (TSG) transistor, a bottom select gate (BSG) transistor, and memory cells positioned between the TSG transistor and the BSG transistor. The memory cells are coupled to word lines.

At 902, during a first program operation of a first memory cell coupled to a first word line (e.g., WL0 in FIG. 2) that is closest to the TSG transistor, apply a first voltage (e.g., $V_9$ in FIG. 6B) to a select line coupled to the TSG. In some implementations, the first program operation can include a channel prepare phase, a channel boost phase, a program pulse phase, a first recovery phase, and a second recovery phase. The first voltage can be applied after a channel pre-charge operation during the channel prepare phase until the end of the second recovery phase.

At 904, during a second program operation of a second memory cell coupled to a second word line (e.g., WL1 in FIG. 2) that is the second closest to the TSG transistor, apply a second voltage (e.g., $V_9$ in FIG. 6B) to the select line coupled to the TSG. The second voltage is higher than or equal to the first voltage. In some implementations, the second program operation can include a channel prepare phase, a channel boost phase, a program pulse phase, a first recovery phase, and a second recovery phase. The second voltage can be applied after a channel pre-charge operation during the channel prepare phase until the end of the second recovery phase.

At 906, during a third program operation of a third memory cell coupled to a third word line (e.g., one of WL2-WLn in FIG. 2) that is farther from the TSG transistor than the first word line and the second word line, apply a third voltage (e.g., $V_4$ in FIG. 6B) to the select line coupled to the TSG. The third voltage is higher than the first voltage and the second voltage. In some implementations, the third program operation can include a channel prepare phase, a channel boost phase, a program pulse phase, a first recovery phase, and a second recovery phase. The third voltage can be applied after a channel pre-charge operation during the channel prepare phase until the end of the second recovery phase.

Figure 10:
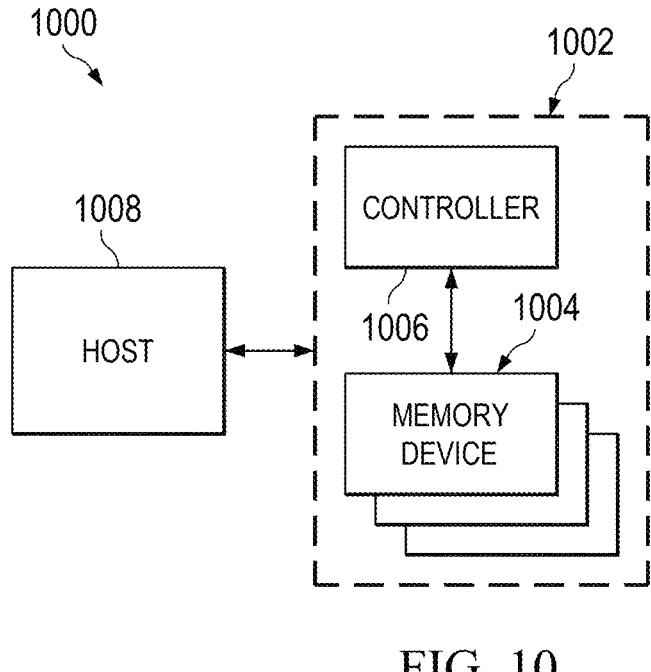
FIG. 10 illustrates a block diagram of an example system having a memory device, according to some aspects of the present disclosure.

FIG. 10 illustrates a block diagram of an example system 1000 having a memory device, according to some aspects of the present disclosure. System 1000 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 10, system 1000 can include a host 1008 and a memory system 1002 having one or more memory devices 1004 and a memory controller 1006. Host 1008 can be a processor of an electronic device, such as a central processing unit (CPU), or a system-on-chip (SoC), such as an application processor (AP). Host 1008 can be configured to send or receive data to or from memory devices 1004.

Memory device 1004 can be any memory device disclosed in the present disclosure. Memory controller 1006 is coupled to memory device 1004 and host 1008 and is configured to control the memory device 1004, according to some implementations. Memory controller 1006 can manage the data stored in memory device 1004 and communicate with host 1008. In some implementations, memory controller 1006 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1006 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1006 can be configured to control operations of memory device 1004, such as read, erase, and program operations. Memory controller 1006 can also be configured to manage various functions with respect to the data stored or to be stored in memory device 1004 including, but not limited to bad-block management, garbage collection, logical-to-physical address conversion, wear leveling, etc. In some implementations, memory controller 1006 is further configured to process error correction codes (ECCs) with respect to the data read from or written to memory device 1004. Any other suitable functions may be performed by memory controller 1006 as well, for example, formatting memory device 1004.

Memory controller 1006 can communicate with an external device (e.g., host 1008) according to a particular communication protocol. For example, memory controller 1006 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 11A:
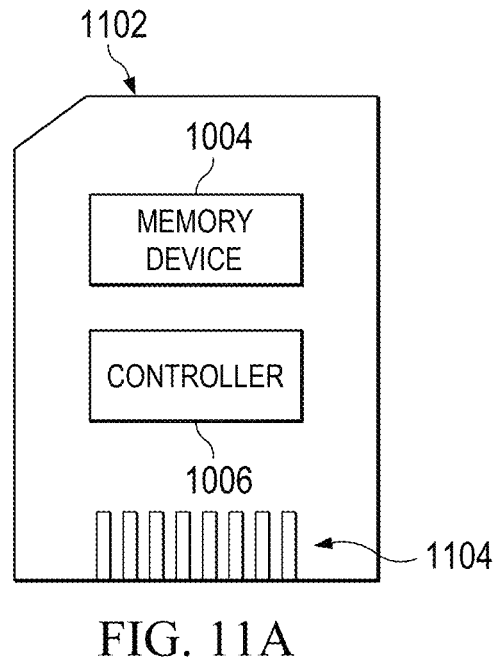
FIG. 11A illustrates a diagram of a memory card having a memory device, according to some aspects of the present disclosure.
Figure 11B:
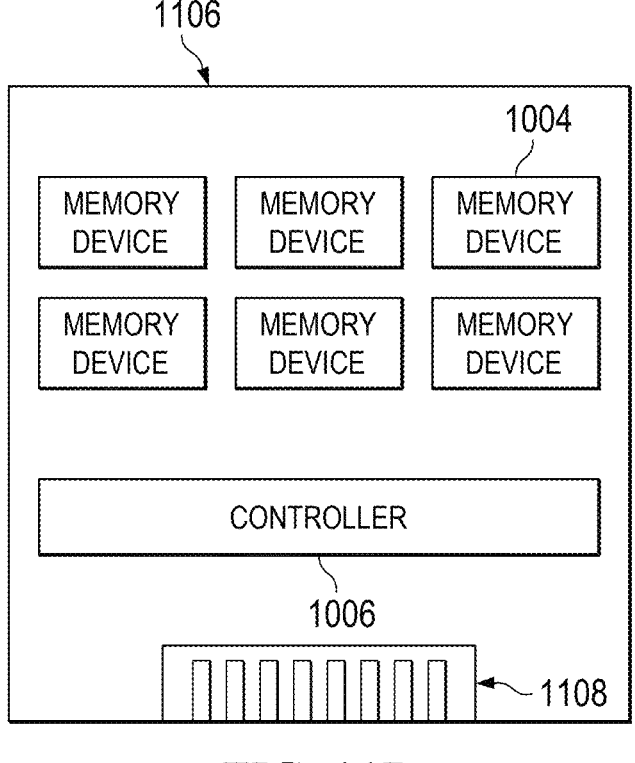
FIG. 11B illustrates a diagram of a solid-state drive (SSD) having a memory device, according to some aspects of the present disclosure.

Memory controller 1006 and one or more memory devices 1004 can be integrated into various types of storage devices. For example, memory controller 1006 and one or more memory devices 1004 can be packaged in a universal Flash storage (UFS) package or an eMMC package. In one example as shown in FIG. 11A, memory controller 1006 and a single memory device 1004 may be integrated into a memory card 1102. Memory card 1102 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1102 can further include a memory card connector 1104 coupling memory card 1102 with a host (e.g., host 1008 in FIG. 10). In another example as shown in FIG. 11B, memory controller 1006 and multiple memory devices 1004 may be integrated into an SSD 1106. SSD 1106 can further include an SSD connector 1108 coupling SSD 1106 with a host (e.g., host 1008 in FIG. 10). In some implementations, the storage capacity and/or the operation speed of SSD 1106 is greater than those of memory card 1102.

Certain aspects of the subject matter described here can be implemented as a memory device. The memory device includes a memory cell array and a peripheral circuit coupled to the memory array. The memory array can include a first memory string (e.g., the memory string 108 in FIG. 2). The first memory string can include a first select gate transistor (e.g., a top select gate transistor), a second select gate transistor (e.g., a bottom select gate transistor), and memory cells positioned between the first select gate transistor and the second select gate transistor. The peripheral circuit is configured to apply, during a first program operation of a first memory cell of the memory cells, a first voltage (e.g., $V_9$ in FIG. 6B) to a select line coupled to the first select gate transistor. The first memory cell is coupled to a first word line (e.g., WL0 in FIG. 2) that is closest to the first select gate transistor among word lines coupled to the memory cells. The peripheral circuit is further configured to apply, during a second program operation of a second memory cell of the memory cells, a second voltage (e.g., $V_4$ in FIG. 6B) to the select line coupled to the first select gate transistor. The second memory cell is coupled to a second word line (e.g., one of WL2-WLn in FIG. 2). The second word line is farther from the first select gate transistor than the first word line. The second voltage is higher than the first voltage.

The memory device can include one or more of the following features.

In some implementations, the peripheral circuit is further configured to apply, during a third program operation of a third memory cell of the memory cells, a third voltage (e.g., $V_9$ in FIG. 6B) to the select line coupled to the first select gate transistor. The third memory cell is coupled to a third word line (e.g., WL1 in FIG. 2). The third word line is closer to the first select gate transistor than the second word line. The third voltage is higher than or equal to the first voltage and lower than the second voltage.

In some implementations, the third word line is a second closest word line to the first select gate transistor after the first word line.

In some implementations, the peripheral circuit is further configured to apply, during a fourth program operation of a fourth memory cell of the memory cells, the second voltage to the select line coupled to the first select gate transistor. The fourth memory cell is coupled to a fourth word line (e.g., one of WL2-WLn in FIG. 2) that is different from the first word line and the third word line.

In some implementations, the peripheral circuit is further configured to apply, during a first time period (e.g., the channel prepare phase 620 in FIG. 6B) of the first program operation, a fourth voltage (e.g., $V_9$-deltaV in FIG. 6B) to the select line coupled to the first select gate transistor. The fourth voltage is lower than the first voltage. The peripheral circuit is further configured to apply, during a second time period (e.g., through the channel boost phase 622, the program pulse phase 624, the first recovery phase 626 and the second recovery phase 628 in FIG. 6B) of the first program operation, the first voltage to the select line coupled to the first select gate transistor. The second time period follows the first time period.

In some implementations, the second time period includes a third time period (e.g., the channel boost phase 622 in FIG. 6B), a fourth time period (e.g., the program pulse phase 624 in FIG. 6B) following the third time period, and a fifth time period (e.g., the first recovery phase 626 and the second recovery phase 628 in FIG. 6B) following the fourth time period. The peripheral circuit is further configured to apply a fifth voltage (e.g., $V_2$ in FIG. 6B) to the first word line during the third time period, apply a program voltage (e.g., $V_{pgm}$ in FIG. 6B) to the first word line during the fourth time period, and apply a sixth voltage (e.g., $V_3$ in FIG. 6B) to the first word line during the fifth time period. The fifth voltage and the sixth voltage are higher than the first voltage and lower than the program voltage.

In some implementations, the peripheral circuit is further configured to apply a pass voltage to the second word line during the second time period.

In some implementations, the peripheral circuit is configured to program a memory cell coupled to the first word line before programming a memory cell coupled to the second word line.

In some implementations, the peripheral circuit is configured to program a memory cell coupled to the first word line after programming a memory cell coupled to the second word line.

In some implementations, the peripheral circuit is further configured to apply, during the first program operation, a seventh voltage (e.g., $V_7$ of inhibit BL in FIG. 6B) to a bit line coupled to a second memory string (e.g., the memory string 128 in FIG. 2) of the memory array. The seventh voltage is higher than or equal to a difference between the first voltage and a predetermined threshold voltage of a first select gate transistor (e.g., top select gate transistor) in the second memory string.

Certain aspects of the subject matter described here can be implemented as a method of operating a memory device. The memory device includes a memory cell array that includes a first memory string (e.g., the memory string 108 in FIG. 2). The first memory string can include a first select gate transistor (e.g., a top select gate transistor), a second select gate transistor (e.g., a bottom select gate transistor), and memory cells positioned between the first select gate transistor and the second select gate transistor. The method includes applying, during a first program operation of a first memory cell of the memory cells, a first voltage (e.g., $V_9$ in FIG. 6B) to a select line coupled to the first select gate transistor. The first memory cell is coupled to a first word line (e.g., WL0 in FIG. 2) that is closest to the first select gate transistor among word lines coupled to the memory cells. The method further includes applying, during a second program operation of a second memory cell of the memory cells, a second voltage (e.g., $V_4$ in FIG. 6B) to the select line coupled to the first select gate transistor. The second memory cell is coupled to a second word line (e.g., one of WL2-WLn in FIG. 2). The second word line is farther from the first select gate transistor than the first word line. The second voltage is higher than the first voltage.

The method of performing a program operation by a memory device can include one or more of the following features.

In some implementations, the method further includes applying, during a third program operation of a third memory cell of the memory cells, a third voltage (e.g., $V_9$ in FIG. 6B) to the select line coupled to the first select gate transistor. The third memory cell is coupled to a third word line (e.g., WL1 in FIG. 2). The third word line is closer to the first select gate transistor than the second word line. The third voltage is higher than or equal to the first voltage and lower than the second voltage.

In some implementations, the third word line is a second closest word line to the first select gate transistor after the first word line.

In some implementations, the method includes, applying, during a fourth program operation of a fourth memory cell of the memory cells, the second voltage to the select line coupled to the first select gate transistor. The fourth memory cell is coupled to a fourth word line (e.g., one of WL2-WLn in FIG. 2) that is different from the first word line and the third word line.

In some implementations, the method further includes applying, during a first time period (e.g., the channel prepare phase 620 in FIG. 6B) of the first program operation, a fourth voltage (e.g., $V_9$-deltaV in FIG. 6B) to the select line coupled to the first select gate transistor. The fourth voltage is lower than the first voltage. The method further includes applying, during a second time period (e.g., through the channel boost phase 622, the program pulse phase 624, the first recovery phase 626 and the second recovery phase 628 in FIG. 6B) of the first program operation, the first voltage to the select line coupled to the first select gate transistor. The second time period follows the first time period.

In some implementations, the second time period includes a third time period (e.g., the channel boost phase 622 in FIG. 6B), a fourth time period (e.g., the program pulse phase 624 in FIG. 6B) following the third time period, and a fifth time period (e.g., the first recovery phase 626 and the second recovery phase 628 in FIG. 6B) following the fourth time period. The peripheral circuit is further configured to apply a fifth voltage (e.g., $V_2$ in FIG. 6B) to the first word line during the third time period, apply a program voltage (e.g., $V_{pgm}$ in FIG. 6B) to the first word line during the fourth time period, and apply a sixth voltage (e.g., $V_3$ in FIG. 6B) to the first word line during the fifth time period. The fifth voltage and the sixth voltage are higher than the first voltage and lower than the program voltage.

In some implementations, the method further includes applying a pass voltage to the second word line during the second time period.

In some implementations, the method further includes applying, during the first program operation, a seventh voltage (e.g., e.g., $V_7$ of inhibit BL in FIG. 6B) to a bit line coupled to a second memory string (e.g., the memory string 128 in FIG. 2) of the memory array. The seventh voltage is higher than or equal to a difference between the first voltage and a predetermined threshold voltage of a first select gate transistor (e.g., top select gate transistor) in the second memory string.

Certain aspects of the subject matter described here can be implemented as a memory system. The memory system includes a memory device and a controller coupled to the memory device and configured to control the memory device. The memory device includes a memory cell array and a peripheral circuit coupled to the memory array. The memory array can include a memory string (e.g., the memory string 108 in FIG. 2). The memory string can include a first select gate transistor (e.g., a top select gate transistor), a second select gate transistor (e.g., a bottom select gate transistor), and memory cells positioned between the first select gate transistor and the second select gate transistor. The peripheral circuit is configured to apply, during a first program operation of a first memory cell of the memory cells, a first voltage (e.g., $V_9$ in FIG. 6B) to a select line coupled to the first select gate transistor. The first memory cell is coupled to a first word line (e.g., WL0 in FIG. 2) that is closest to the first select gate transistor among word lines coupled to the memory cells. The peripheral circuit is further configured to apply, during a second program operation of a second memory cell of the memory cells, a second voltage (e.g., $V_4$ in FIG. 6B) to the select line coupled to the first select gate transistor. The second memory cell is coupled to a second word line (e.g., one of WL2-WLn in FIG. 2). The second word line is farther from the first select gate transistor than the first word line. The second voltage is higher than the first voltage.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multi-tasking or parallel processing (or a combination of multi-tasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:
   a memory array comprising a first memory string, wherein the first memory string comprises a first select gate transistor, a second select gate transistor, and memory cells positioned between the first select gate transistor and the second select gate transistor; and
   a peripheral circuit coupled to the memory array, wherein the peripheral circuit is configured to:
      apply, during a first program operation of a first memory cell of the memory cells, a first voltage to a select line coupled to the first select gate transistor, wherein the first memory cell is coupled to a first word line that is closest to the first select gate transistor among word lines coupled to the memory cells; and
      apply, during a second program operation of a second memory cell of the memory cells, a second voltage to the select line coupled to the first select gate transistor, wherein the second memory cell is coupled to a second word line that is farther from the first select gate transistor than the first word line, and wherein the second voltage is higher than the first voltage.

2. The memory device of claim 1, wherein the peripheral circuit is further configured to:
   apply, during a third program operation of a third memory cell of the memory cells, a third voltage to the select line coupled to the first select gate transistor, wherein the third memory cell is coupled to a third word line that is closer to the first select gate transistor than the second word line, and wherein the third voltage is higher than or equal to the first voltage and lower than the second voltage.

3. The memory device of claim 2, wherein the third word line is a second closest word line to the first select gate transistor after the first word line.

4. The memory device of claim 2, wherein the peripheral circuit is further configured to:

apply, during a fourth program operation of a fourth memory cell of the memory cells, the second voltage to the select line coupled to the first select gate transistor, wherein the fourth memory cell is coupled to a fourth word line that is different from the first word line and the third word line.

5. The memory device of claim 1, wherein the peripheral circuit is further configured to:

apply, during a first time period of the first program operation, a fourth voltage to the select line coupled to the first select gate transistor, wherein the fourth voltage is lower than the first voltage; and apply, during a second time period of the first program operation, the first voltage to the select line coupled to the first select gate transistor, wherein the second time period follows the first time period.

6. The memory device of claim 5, wherein the second time period comprises a third time period, a fourth time period following the third time period, and a fifth time period following the fourth time period, and wherein the peripheral circuit is further configured to:

apply, during the third time period, a fifth voltage to the first word line;

apply, during the fourth time period, a program voltage to the first word line; and apply, during the fifth time period, a sixth voltage to the first word line, wherein the fifth voltage and the sixth voltage are higher than the first voltage and lower than the program voltage.

7. The memory device of claim 6, wherein the peripheral circuit is further configured to:

apply, during the second time period, a pass voltage to the second word line.

8. The memory device of claim 1, wherein the peripheral circuit is configured to program a memory cell coupled to the first word line before programming a memory cell coupled to the second word line.

9. The memory device of claim 1, wherein the peripheral circuit is configured to program a memory cell coupled to the first word line after programming a memory cell coupled to the second word line.

10. The memory device of claim 1, wherein the peripheral circuit is further configured to:

apply, during the first program operation, a seventh voltage to a bit line coupled to a second memory string of the memory array, wherein the seventh voltage is higher than or equal to a difference between the first voltage and a predetermined threshold voltage of a first select gate transistor in the second memory string.

11. The memory device of claim 1, wherein the memory array comprise one or more decks of memory cells, wherein a first deck of the one or more decks of memory cells is adjacent to a second deck of the one or more decks of memory cells, wherein a word line coupled to a memory cell in the first deck that is closest to the second deck is a dummy word line, and wherein a word line coupled to a memory cell in the second deck that is closest to the first deck is a dummy word line.

12. A method for operating a memory device, wherein the method comprises:

applying, during a first program operation of a first memory cell, a first voltage to a select line coupled to a first select gate transistor, wherein the memory device comprises a memory array, wherein the memory array comprises a memory string comprising the first select gate transistor, a second select gate transistor, and memory cells positioned between the first select gate transistor and the second select gate transistor, wherein a first word line coupled to the first memory cell of the memory cells is closest to the first select gate transistor among word lines coupled to the memory cells; and applying, during a second program operation of a second memory cell of the memory cells, a second voltage to the select line coupled to the first select gate transistor, wherein the second memory cell is coupled to a second word line farther from the first select gate transistor than the first word line, and wherein the second voltage is higher than the first voltage.

13. The method of claim 12, further comprising:

applying, during a third program operation of a third memory cell of the memory cells, a third voltage to the select line coupled to the first select gate transistor, wherein the third memory cell is coupled to a third word line that closer to the first select gate transistor than the second word line, and wherein the third voltage is higher than or equal to the first voltage and lower than the second voltage.

14. The method of claim 13, wherein the third word line is a second closest word line to the first select gate transistor after the first word line.

15. The method of claim 13, further comprising:

applying, during a fourth program operation of a fourth memory cell of the memory cells, the second voltage to the select line coupled to the first select gate transistor, wherein the fourth memory cell is coupled to a fourth word line that is different from the first word line and the third word line.

16. The method of claim 12, further comprising:

applying, during a first time period of the first program operation, a fourth voltage to the select line coupled to the first select gate transistor, wherein the fourth voltage is lower than the first voltage; and applying, during a second time period of the first program operation, the first voltage to the select line coupled to the first select gate transistor, wherein the second time period follows the first time period.

17. The method of claim 16, wherein the second time period comprises a third time period, a fourth time period following the third time period, and a fifth time period following the fourth time period, wherein the method further comprises:

applying, during the third time period, a fifth voltage to the first word line;

applying, during the fourth time period, a program voltage to the first word line; and applying, during the fifth time period, a sixth voltage to the first word line, wherein the fifth voltage and the sixth voltage are higher than the first voltage and lower than the program voltage.

18. The method of claim 17, further comprising:

applying, during the second time period, a pass voltage to the second word line.

19. The method of claim 12, further comprising:

applying, during the first program operation, a seventh voltage to a bit line coupled to a second memory string of the memory array, wherein the seventh voltage is higher than or equal to a difference between the first voltage and a predetermined threshold voltage of a first select gate transistor in the second memory string.

20. A memory system, comprising:

a memory device, comprising:

a memory cell array comprising a memory string, wherein the memory string comprises a first select gate transistor, a second select gate transistor, and memory cells positioned between the first select gate transistor and the second select gate transistor; and a peripheral circuit coupled to the memory cell array and configured to:

apply, during a first program operation of a first memory cell of the memory cells, a first voltage to a select line coupled to the first select gate transistor, wherein the first memory cell is coupled to a first word line that is closest to the first select gate transistor among word lines coupled to the memory cells; and apply, during a second program operation of a second memory cell of the memory cells, a second voltage to the select line coupled to the first select gate transistor, wherein the second memory cell is coupled to a second word line that is farther from the first select gate transistor than the first word line, and wherein the second voltage is higher than the first voltage; and a controller coupled to the memory device and configured to control the memory device.

* * * * *